(12) United States Patent
Hong et al.

(10) Patent No.: US 10,332,831 B2
(45) Date of Patent: Jun. 25, 2019

(54) SEMICONDUCTOR DEVICE INCLUDING A BIT LINE

(71) Applicant: SAMSUNG ELECTRONICS CO., LTD., Suwon-si, Gyeonggi-Do (KR)

(72) Inventors: Augustin Jinwoo Hong, Seoul (KR); Dae-Ik Kim, Hwaseong-si (KR); Chan-Sic Yoon, Anyang-si (KR); Ki-Seok Lee, Hwaseong-si (KR); Dong-Min Han, Suwon-si (KR); Sung-Ho Jang, Seoul (KR); Yoo-Sang Hwang, Suwon-si (KR); Bong-Soo Kim, Yongin-si (KR); Je-Min Park, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 63 days.

(21) Appl. No.: 15/638,552

(22) Filed: Jun. 30, 2017

(65) Prior Publication Data
US 2018/0158773 A1 Jun. 7, 2018

(30) Foreign Application Priority Data
Dec. 2, 2016 (KR) .................... 10-2016-0163901

(51) Int. Cl.
*H01L 27/108* (2006.01)
*H01L 23/522* (2006.01)
(Continued)

(52) U.S. Cl.
CPC .... *H01L 23/5226* (2013.01); *H01L 21/76802* (2013.01); *H01L 27/10888* (2013.01);
(Continued)

(58) Field of Classification Search
CPC .......... H01L 23/5226; H01L 27/10888; H01L 27/10894; H01L 21/76802; H01L 27/11568; H01L 27/10814
See application file for complete search history.

(56) References Cited

U.S. PATENT DOCUMENTS 7,141,471 B2 11/2006 Yamada et al.
8,043,923 B2 10/2011 Kim et al.
(Continued)

FOREIGN PATENT DOCUMENTS

KR 1020130026266 3/2013
KR 1020140110146 9/2014
(Continued)

*Primary Examiner* — Khiem D Nguyen
(74) *Attorney, Agent, or Firm* — F. Chau & Associates, LLC

(57) ABSTRACT

A semiconductor device includes a substrate including a cell array region including a cell active region. An insulating pattern is on the substrate. The insulating pattern includes a direct contact hole which exposes the cell active region and extends into the cell active region. A direct contact conductive pattern is in the direct contact hole and is connected to the cell active region. A bit line is on the insulating pattern. The bit line is connected to the direct contact conductive pattern and extends in a direction orthogonal to an upper surface of the insulating pattern. The insulating pattern includes a first insulating pattern including a non-metal-based dielectric material and a second insulating pattern on the first insulating pattern. The second insulating pattern includes a metal-based dielectric material having a higher dielectric constant than a dielectric constant of the first insulating pattern.

14 Claims, 21 Drawing Sheets

(51) Int. Cl.
*H01L 27/11568* (2017.01)
*H01L 21/768* (2006.01)

(52) U.S. Cl.
CPC .. *H01L 27/10894* (2013.01); *H01L 27/11568* (2013.01); *H01L 27/10814* (2013.01)

(56) References Cited

U.S. PATENT DOCUMENTS

| | | | |
|---|---|---|---|
| 9,082,647 B2 | 7/2015 | Jang et al. | |
| 9,196,619 B2 | 11/2015 | Wu | |
| 9,263,456 B2 | 2/2016 | Saino | |
| 9,337,203 B2 | 5/2016 | Hwang et al. | |
| 2009/0035904 A1* | 2/2009 | Bhattacharyya | B82Y 10/00 |
| | | | 438/261 |
| 2013/0056823 A1 | 3/2013 | Kim et al. | |
| 2014/0246729 A1 | 9/2014 | Jang et al. | |
| 2015/0102504 A1* | 4/2015 | Park | H01L 23/5221 |
| | | | 257/776 |
| 2015/0123238 A1* | 5/2015 | Jang | H01L 27/10864 |
| | | | 257/503 |
| 2015/0303201 A1* | 10/2015 | Lee | H01L 27/10885 |
| | | | 438/586 |
| 2016/0049398 A1 | 2/2016 | Jang et al. | |
| 2016/0118331 A1* | 4/2016 | Kim | H01L 27/10894 |
| | | | 257/401 |
| 2016/0163708 A1 | 6/2016 | Jang et al. | |

FOREIGN PATENT DOCUMENTS

| | | |
|---|---|---|
| KR | 1020150051513 | 5/2015 |
| KR | 1020150088634 | 8/2015 |
| KR | 1020150121767 | 10/2015 |
| KR | 101617241 | 4/2016 |
| KR | 1020160067618 | 6/2016 |

* cited by examiner

SEMICONDUCTOR DEVICE INCLUDING A BIT LINE

CROSS-REFERENCE TO RELATED APPLICATION

This application claims priority under 35 U.S.C. § 119 to Korean Patent Application No. 10-2016-0163901 filed on Dec. 2, 2016 in the Korean Intellectual Property Office, the disclosure of which is incorporated by reference herein in its entirety.

TECHNICAL FIELD

Exemplary embodiments of the present inventive concept relate to a semiconductor device, and more particularly to a semiconductor device including a bit line.

DISCUSSION OF RELATED ART

In the electronics industry, there has been an increasing demand for low cost electronic devices with the development of lighter, smaller, faster, more multi-functional, and/or higher performance electronic systems. Semiconductor devices used for the electronic devices may be relatively highly integrated, and thus elements of the semiconductor devices may be relatively small. Thus, an aspect ratio of lines including conductive patterns for the semiconductor devices may be increased.

SUMMARY

According to an exemplary embodiment of the present inventive concept, a semiconductor device includes a substrate including a cell array region including a cell active region. An insulating pattern is on the substrate. The insulating pattern includes a direct contact hole which exposes the cell active region and extends into the cell active region. A direct contact conductive pattern is in the direct contact hole and is connected to the cell active region. A bit line is on the insulating pattern. The bit line is connected to the direct contact conductive pattern and extends in a direction orthogonal to an upper surface of the insulating pattern. The insulating pattern includes a first insulating pattern including a non-metal-based dielectric material and a second insulating pattern on the first insulating pattern. The second insulating pattern includes a metal-based dielectric material having a higher dielectric constant than a dielectric constant of the first insulating pattern.

According to an exemplary embodiment of the present inventive concept, a semiconductor device includes a substrate including a cell array region and a peripheral circuit region. The cell array region includes a cell active region and the peripheral circuit region including a peripheral circuit active region. A cell insulating pattern is on the substrate in the cell array region. A direct contact hole penetrates the cell insulating pattern. The direct contact hole exposes the cell active region and extends into the cell active region. A direct contact conductive pattern is in the direct contact hole and is connected to the cell active region. A bit line is connected to the direct contact conductive pattern in the cell array region. The bit line extends in a first direction on the cell insulating pattern and includes a first metal-based conductive pattern in direct contact with the cell insulating pattern. A first peripheral circuit gate insulating layer and a first gate electrode structure are sequentially disposed on the peripheral circuit active region in the peripheral circuit region. The first gate electrode includes a first metal-based work function adjustment pattern and a second metal-based conductive pattern including a same material as the first metal-based conductive pattern. Each of the cell insulating pattern and the first peripheral circuit gate insulating layer include a first insulating pattern and a second insulating pattern on the first insulating pattern. The first insulating pattern includes a non-metal based dielectric material. The second insulating pattern is thinner than the first insulating pattern and includes a metal-based dielectric material having a higher dielectric constant than the first insulating pattern.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Exemplary embodiments of the present inventive concept will be described below in more detail with reference to the accompanying drawings. In this regard, the exemplary embodiments may have different forms and should not be construed as being limited to the exemplary embodiments of the present inventive concept described herein.

Figure 1:
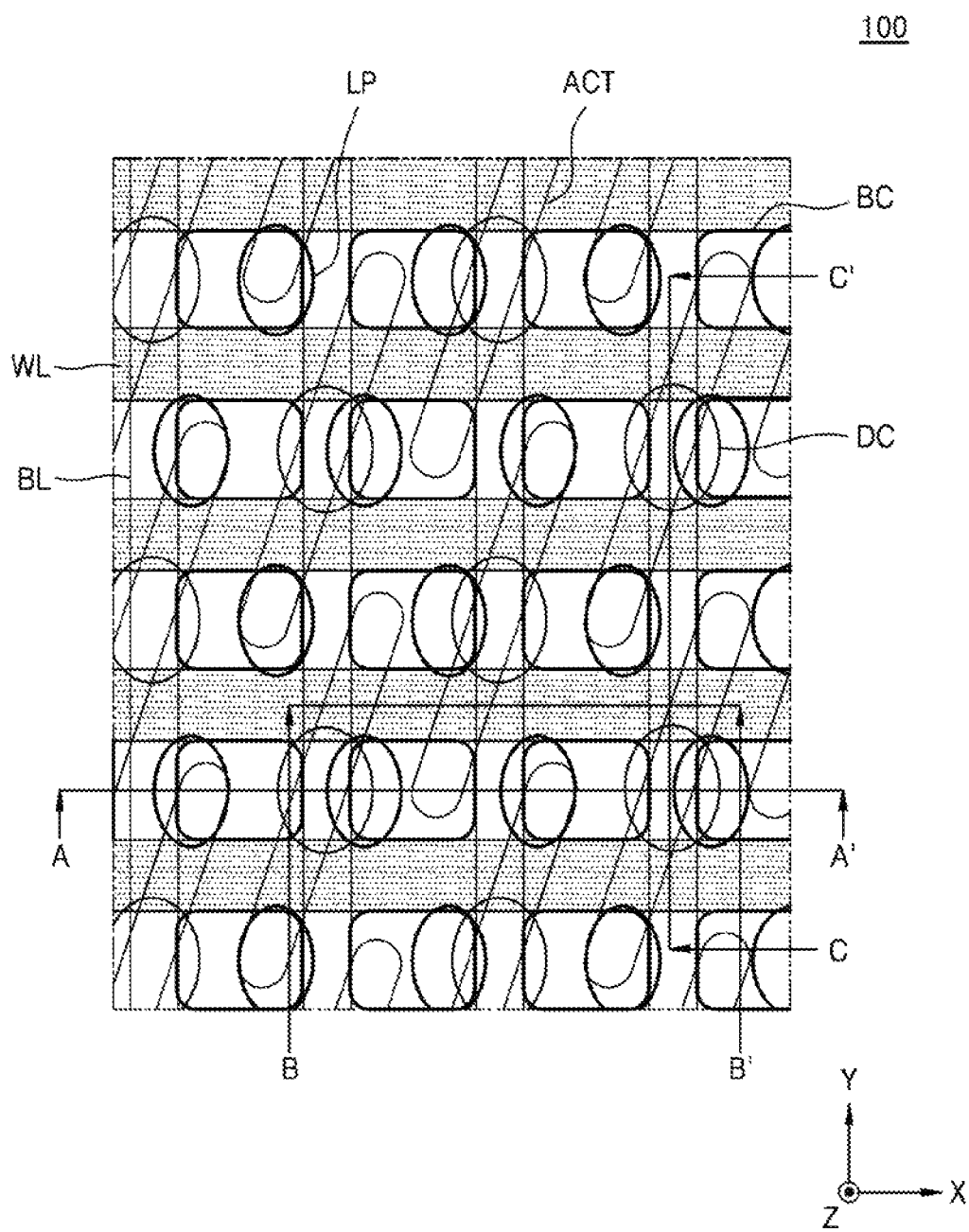
FIG. 1 is a schematic layout diagram illustrating elements in a cell array region of a semiconductor device according to an exemplary embodiment of the present inventive concept.

FIG. 1 is a schematic layout diagram illustrating elements in a cell array region of a semiconductor device according to an exemplary embodiment of the present inventive concept.

Referring to FIG. 1, a semiconductor device 100 may include a plurality of active regions ACT. In some exemplary embodiments of the present inventive concept, the active regions ACT may be arranged to have a major axis oblique to both a first direction (e.g., an X direction) and a second direction (e.g., a Y direction). The active regions ACT may be active regions formed in a cell array region CELL (see, e.g., FIGS. 2-8 and FIGS. 10-16). In some exemplary embodiments of the present inventive concept, active regions may be formed in a core CORE and peripheral circuit region PERI (see, e.g., CORE/PERI in FIG. 2 or C/P-A1, C/P-A2, C/P-B1, C/P-B1 in FIGS. 3-8, FIG. 10 and FIGS. 12-16) of the semiconductor device 100. The core and peripheral circuit region CORE/PERI may be referred to as a peripheral circuit region herein, and each of the active regions ACT in the cell array region and each of the active regions in the peripheral circuit region may be respectively referred to as a cell active region and a peripheral circuit active region herein.

A plurality of word lines WL may cross the active regions ACT and may extend substantially parallel to each other in the first direction (e.g., the X direction). A plurality of bit lines BL may be positioned over the word line WL, respectively, and may extend substantially parallel to each other in the second direction (e.g., the Y direction) crossing the first direction (e.g., the X direction).

A bit line of the plurality of bit lines BL may be connected to a respective active region of the plurality of active regions ACT through a respective direct contacts DC.

In some exemplary embodiments of the present inventive concept, a plurality of buried contacts BC may be disposed between two adjacent bit lines BL. The buried contacts BC may each extend over any one of the two adjacent bit lines BL. In some exemplary embodiments of the present inventive concept, the buried contacts BC may be arranged in a row along the first direction (e.g., the X direction) and the second direction (e.g., the Y direction).

A plurality of landing pads LP may be disposed on the buried contacts BC, respectively. The buried contacts BC and the landing pads LP may connect lower electrodes of capacitors over the bit lines to the active regions ACT. Each of the landing pads LP may partially overlap a respective buried contact BC.

FIGS. 2 through 8 are cross-sectional views illustrating a method of manufacturing a semiconductor device according to an exemplary embodiment of the present inventive concept. The cell array region CELL in FIG. 2 corresponds to cross-section views taken along lines A-A', B-B' and C-C' of FIG. 1. The cell array region CELL in FIGS. 3 through 8 corresponds to cross-sectional views taken along lines A-A' and C-C' of FIG. 1. The peripheral circuit region CORE/PERI in FIG. 2 and first through fourth peripheral circuit regions C/P-A1, C/P-A2, C/P-B1 and C/P-B2 in FIGS. 3 through 8 correspond to cross-sectional views taken along the X direction and the Y direction in FIG. 1.

Figure 2:
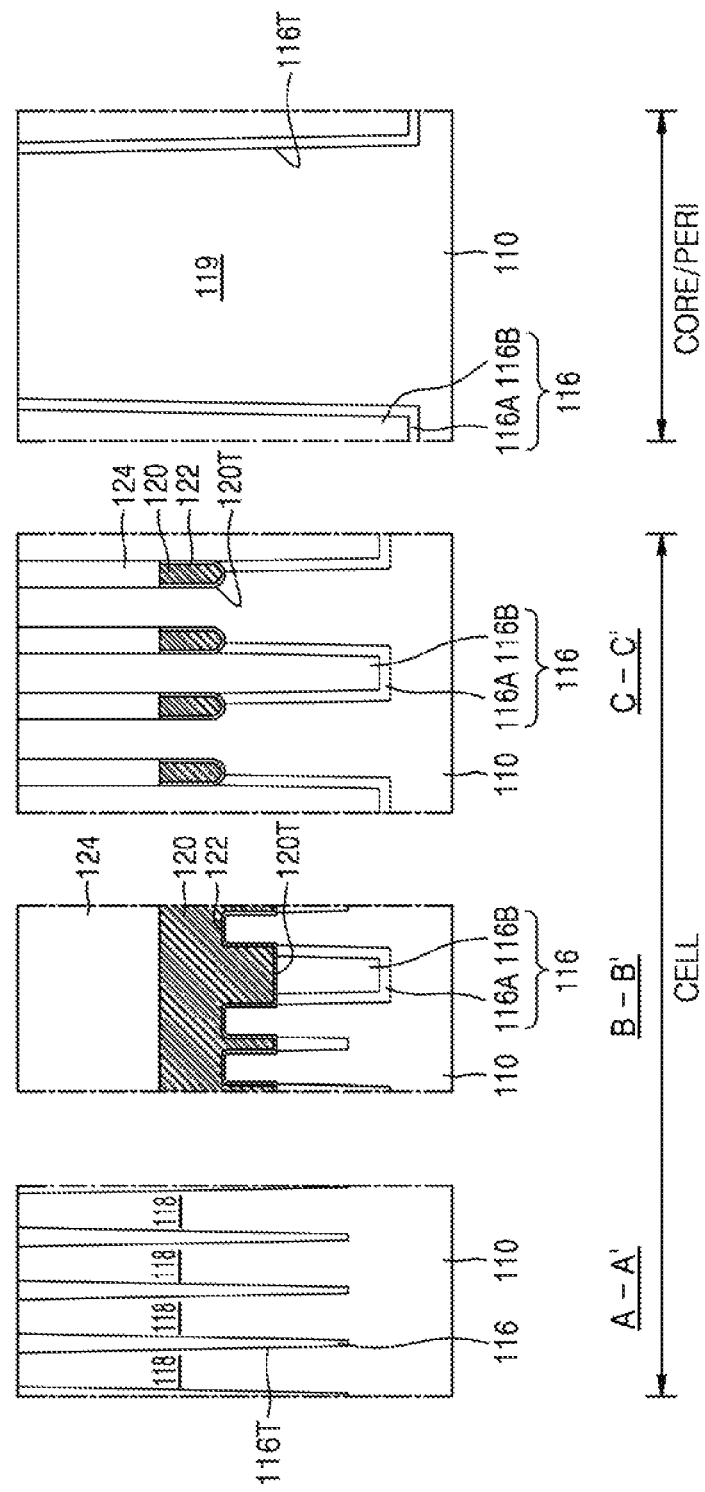
FIGS. 2 through 8 are cross-sectional views illustrating stages of a method of manufacturing a semiconductor device according to an exemplary embodiment of the present inventive concept.

Referring to FIG. 2, a device isolation trench 116T may be formed in a substrate 110 including the cell array region CELL and the peripheral circuit region CORE/PERI. A device isolation layer 116 may be formed in the device isolation trench 116T. The device isolation layer 116 may define each cell active region 118 in the cell array region CELL and may define each peripheral circuit active region 119 in the peripheral circuit region CORE/PERI. The cell active region 118 may have a relatively long oval shape like the active region ACT as shown in FIG. 1. The active regions ACT may each have a relatively long dimension oblique to the X and Y directions, and a relatively short dimension that is oblique to the X and Y directions in a direction perpendicular to the relatively long dimension.

The substrate 110 may include, for example, silicon, such as crystalline silicon, polycrystalline silicon or amorphous silicon. The substrate 110 may include a semiconductor element such as germanium or a semiconductor compound such as silicon germanium, silicon carbide, gallium arsenide, indium arsenide or indium phosphide. The substrate 110 may be a silicon-on-insulator (SOI) substrate. For example, the substrate 110 may include a buried oxide (BOX) layer. The substrate 110 may include a conductive region, for example, a doped well or a structure doped with impurities.

In some exemplary embodiments of the present inventive concept, a strain layer may be formed on a portion of the substrate 110 in the peripheral circuit active region 119. For example, the strain layer may be formed on the substrate 110 in the second peripheral circuit region C/P-A2 (refer to FIG. 3) and the fourth peripheral circuit region C/P-B2 (refer to FIG. 3).

The device isolation layer 116 may include, for example, at least one of silicon oxide, silicon nitride or silicon oxynitride. The device isolation layer 116 may have a single layer structure including one type of an insulating material, a double layer structure including two types of insulating materials or a multilayer structure including at least three types of insulating materials.

In some exemplary embodiments of the present inventive concept, the device isolation layer 116 may include a first device isolation layer 116A and a second device isolation layer 116B. The first and second device isolation layers 116A and 116B may include different materials from each other. For example, the first device isolation layer 116A may include an oxide, and the second device isolation layer 116B may include a nitride. However, a configuration of the device isolation layer 116 according to exemplary embodiments of the present inventive concept is not limited thereto.

A plurality of word line trenches 120T may be formed in the cell array region CELL of the substrate 110. The word line trenches 120T may extend in the first direction (e.g., the X direction illustrated in FIG. 1) substantially in parallel to each other and may each have a linear shape crossing each of the cell active regions 118. Referring to the cross-sectional view taken along the line B-B' in FIG. 2, the device isolation layer 116 and the substrate 110 may be etched by separate etching processes to form the word line trenches 120T which each have a stepped bottom surface, such that an etching depth of the device isolation layer 116 and an etching depth of the substrate 110 are different from each other.

After cleaning the resulting structure having the word line trenches 120T, a gate dielectric layer 122, each of a plurality of word lines 120 and each of a plurality of buried insulating layers 124 may be sequentially formed in each of the word line trenches 120T. The word lines 120 may form the word lines WL described with reference to FIG. 1.

An upper surface of each of the word lines 120 may be positioned at a lower level than an upper surface of the substrate 110. The word lines 120 may each have an uneven bottom surface. In the cell active regions 118, saddle-fin transistors (FinFETs) may be formed.

As used herein, the term "level" may refer to a height in a third direction (e.g., a Z direction in FIG. 1) orthogonal to an upper surface of the substrate 110.

In some exemplary embodiments of the present inventive concept, after forming the word lines 120, impurity ions may be implanted in the cell active regions 118 at opposite sides of each of word lines 120 such that source/drain regions may be formed in the cell active regions 118. In some exemplary embodiments of the present inventive concept, before forming the source/drain regions, an impurity ion implantation process may be performed to form the source/drain regions. The word lines 120 may each include, for example, titanium, titanium nitride, tantalum, tantalum nitride, tungsten, tungsten nitride, titanium silicon nitride, tungsten silicon nitride or combinations therof.

The gate dielectric layer 122 may include, for example, silicon oxide, silicon nitride, silicon oxynitride, oxide/nitride/oxide (ONO), and/or a high-k dielectric material with a dielectric constant greater than a dielectric constant of silicon oxide. For example, the gate dielectric layer 122 may have a dielectric constant of from about 10 to about 25. In some exemplary embodiments of the present inventive concept, the gate dielectric layer 122 may include hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and/or lead scandium tantalum oxide (PbScTaO). For example, the gate dielectric layer 122 may include $HfO_2$, $Al_2O_3$, $HfAl_2O_3$, $Ta_2O_3$ and/or $TiO_2$.

The buried insulating layers 124 may each have an upper surface positioned at the same level as the upper surface of the substrate 110. The buried insulating layers 124 may include, for example silicon oxide, silicon nitride, silicon oxynitride or a combination thereof.

Figure 3:
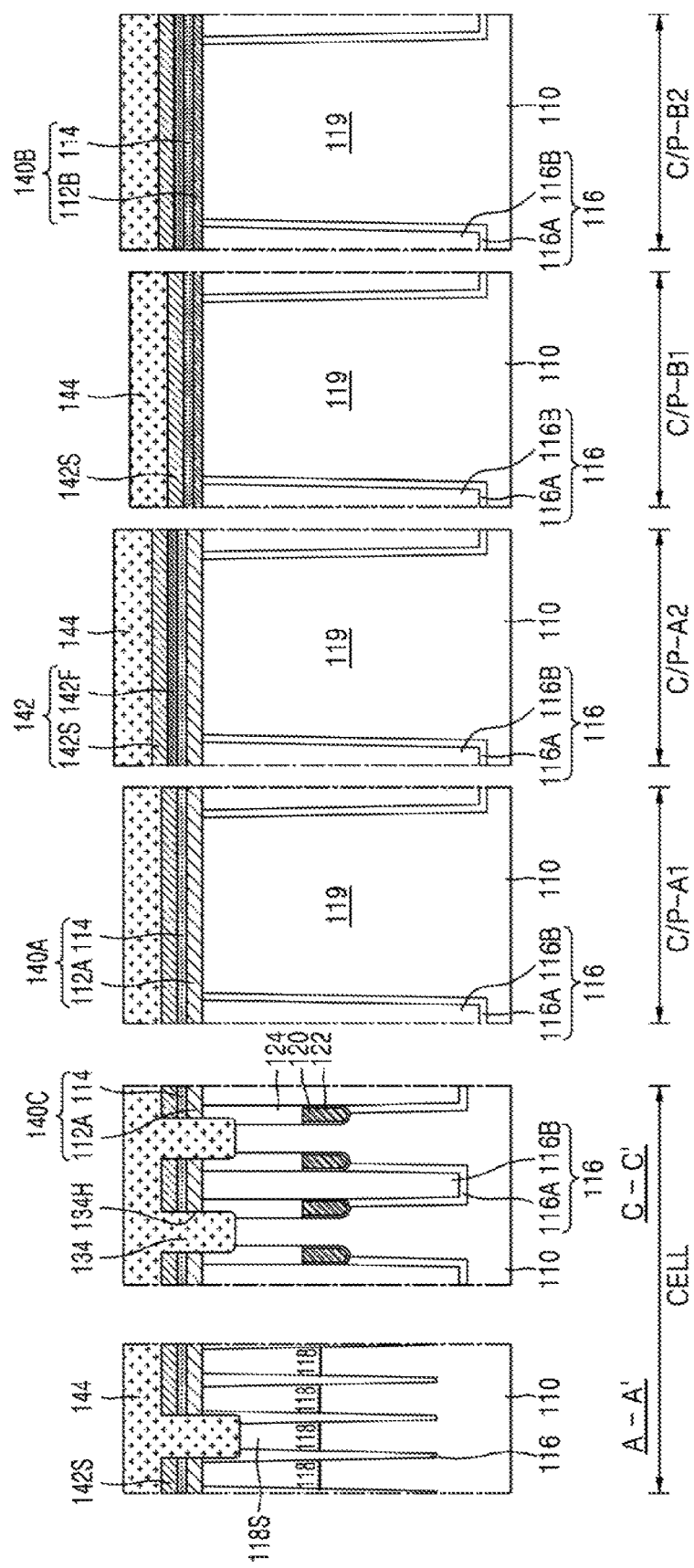

Referring to FIG. 3, a first insulating pattern 112A may be formed on the substrate 110 in the cell array region CELL and the first and second peripheral circuit regions C/P-A1 and C/P-A2. A second insulating pattern 112B may be formed on the substrate 110 in the third and fourth peripheral circuit regions CP-B1 and CP-B2. A third insulating pattern 114 may be formed on the first and second insulating patterns 112A and 112B in the cell array region CELL and the first through fourth peripheral circuit regions C/P-A1, C/P-A2, CP-B1 and CP-B2. The peripheral circuit region CORE/PERI may correspond to each of the first through fourth peripheral circuit regions C/P-A1, C/P-A2, CP-B1 and CP-B2 in FIG. 3. The first insulating pattern 112A in the cell array region CELL and the first insulating pattern 112A in the first and second peripheral circuit regions C/P-A1 and C/P-A2 may be formed at substantially a same time and may each include a same material. The second insulating pattern 112B in the third peripheral circuit region C/P-B1 and the second insulating pattern 112B in the fourth peripheral circuit region C/P-B2 may be formed at substantially a same time and may each include a same material. The third insulating pattern 114 in the cell array region CELL and the third insulating pattern 114 in the first through fourth peripheral circuit region C/P-A1, C/P-A2, C/P-B1 and C/P-B2 may be formed at substantially a same time and may each include a same material.

Thus, a cell insulating pattern 140C including the first insulating pattern 112A and the third insulating pattern 114 may be formed in the cell array region CELL. A first peripheral circuit gate insulating layer 140A including the first insulating pattern 112A and the third insulating pattern 114 may be formed in the first and second peripheral circuit regions C/P-A1 and C/P-A2. A second peripheral circuit gate insulating layer 140B may be formed in the third and fourth peripheral circuit regions C/P-B1 and C/P-B2. The cell insulating pattern 140C and the first peripheral circuit gate insulating layer 140A may include a same material as each other.

In some exemplary embodiments of the present inventive concept, the first insulating pattern 112A may be formed by forming a preliminary first insulating layer on the substrate 110 in the cell array region CELL and the first through fourth peripheral circuit regions C/P-A1, C/P-A2, C/P-B1 and C/P-B2 and removing a portion of the preliminary first insulating layer formed in the third and fourth peripheral circuit regions C/P-B1 and C/P-B2 by a photolithography process. In some exemplary embodiments of the present inventive concept, the second insulating pattern 112B may be formed by forming a preliminary second insulating layer on the substrate 110 in the cell array region CELL and the first through fourth peripheral circuit regions C/P-A1, C/P-A2, C/P-B1 and C/P-B2 and removing a portion of the preliminary second insulating layer formed in the cell array region CELL and the first and second peripheral circuit regions C/P-A1 and C/P-A2 by a photolithography process.

In some exemplary embodiments of the present inventive concept, the second insulating pattern 112B may be formed after forming the first insulating pattern 112A. In some exemplary embodiments of the present inventive concept, the first insulating pattern 112A may be formed after forming the second insulating pattern 112B.

The first insulating pattern 112A and the second insulating pattern 112B may each include a non-metal-based dielectric material. For example, the first and second insulating patterns 112A and 112B may each include a silicon oxide, silicon nitride, silicon oxynitride or a combination thereof.

The second insulating pattern 112B may have a dielectric constant greater than that of the first insulating pattern 112A. A thickness of the first insulating pattern 112A may be greater than that of the second insulating pattern 112B. In some exemplary embodiments of the present inventive concept, the first insulating pattern 112A may include silicon oxide, and the second insulating pattern 112B may include silicon oxynitride.

The third insulating pattern 114 may include a metal-based dielectric material. The third insulating pattern 114 may have a dielectric constant greater than that of each of the first and second insulating patterns 112A and 112B.

The third insulating pattern 114 may include, for example, at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO).

A first metal-based work function adjustment layer 142S may be formed on the third insulating pattern 114 in the ell array region CELL and the first and the third peripheral circuit regions C/P-A1 and C/P-B1. A second metal-based work function adjustment layer 142 may be formed on the third insulating pattern 114 in the second and fourth peripheral circuit regions C/P-A2 and C/P-B2.

In some exemplary embodiments of the present inventive concept, the second metal-based work function adjustment layer 142 may include a stack structure including a subsidiary metal-based work function adjustment layer 142F and the first metal-based work function adjustment layer 142S. Referring to FIG. 3, the second metal-based work function adjustment layer 142 may include a structure in which the first metal-based work function adjustment layer 142S is stacked on the subsidiary metal-based work function adjustment layer 142F; however, exemplary embodiments of the present inventive concept are not limited thereto. For example, the second metal-based work function adjustment layer 142 may include a structure in which the subsidiary metal-based work function adjustment layer 142F is stacked on the first metal-based work function adjustment layer 142S.

In some exemplary embodiments of the present inventive concept, the first metal-based work function adjustment layer 142S or the second metal-based work function adjustment layer 142 may each include a metal, a conductive metal nitride, a conductive metal carbide, a conductor including a metal atom or a laminated structure thereof.

The first metal-based work function adjustment layer 142S or the second metal-based work function adjustment layer 142 may include, for example, at least one of titanium, tantalum, aluminum, nickel, cobalt, lanthanum, palladium, niobium, molybdenum, hafnium, iridium, ruthenium, platinum, ytterbium, dysprosium, erbium, titanium aluminum, hafnium silicon molybdenum, titanium nitride, tungsten nitride, tantalum nitride, ruthenium nitride, molybdenum nitride, titanium aluminum nitride, tantalum carbide, titanium carbide or tantalum carbide; however, exemplary embodiments of the present inventive concept are not limited thereto.

In some exemplary embodiments of the present inventive concept, an additional metal-based work function adjustment layer may be further formed on the first metal-based work function adjustment layer 142S in any one of the first and third peripheral circuit regions C/P-A1 and C/P-B1 and/or may be formed on the second metal-based work function adjustment layer 142 in any one of the second and fourth peripheral circuit regions C/P-A2 and C/P-B2.

In the cell array region CELL, a direct contact hole 134H penetrating the cell insulating pattern 140C and the first metal-based work function adjustment layer 142S and a direct contact conductive layer 134 filling the direct contact hole 134H may be formed. A semiconductor-based conductive layer 144 may be formed to substantially cover the cell array region CELL and the first through fourth peripheral circuit regions C/P-A1, C/P-A2, C/P-B1 and C/P-. The semiconductor-based conductive layer 144 may be in direct contact with the direct contact conductive layer 134.

The direct contact hole 134H may expose a source region 118S in each of the cell active regions 118 in the cell array region CELL. The direct contact hole 134H may extend into each of the cell active regions 118 (e.g., the source region 118S).

The direct contact conductive layer 134 may include, for example, silicon, germanium, tungsten, tungsten nitride, cobalt, nickel, aluminum, molybdenum, ruthenium, titanium, titanium nitride, tantalum, tantalum nitride, copper or combinations thereof. In some exemplary embodiments of the present inventive concept, the direct contact conductive layer 134 may include epitaxial silicon. In some exemplary embodiments of the present inventive concept, the direct contact conductive layer 134 may include doped polysilicon.

The semiconductor-based conductive layer 144 may include, for example, a doped semiconductor material. In some exemplary embodiments of the present inventive concept, the semiconductor-based conductive layer 144 may include doped polysilicon. The semiconductor-based conductive layer 144 may substantially cover and may be in direct contact with the first metal-based work function adjustment layer 142S in the cell array region CELL and the first and third peripheral circuit regions C/P-A1 and C/P-B1. The semiconductor-based conductive layer 144 may substantially cover and may be in direct contact with the second metal-based work function adjustment layer 142 in the second and fourth peripheral circuit regions C/P-A2 and C/P-B2.

In some exemplary embodiments of the present inventive concept, after forming the direct contact hole 134H and the direct contact conductive layer 134, the semiconductor-based conductive layer 144 may be formed. In this case, the direct contact conductive layer 134 may be formed to have an upper surface positioned at substantially the same level as an upper surface of the cell insulating pattern 140C.

In some exemplary embodiments of the present inventive concept, after forming the semiconductor-based conductive layer 144, the direct contact hole 134H and the direct contact conductive layer 134 may be formed. The direct contact hole 134H may be formed to penetrate the cell insulating pattern 140C, the first metal-based work function adjustment layer 142S and the semiconductor-based conductive layer 144. The direct contact conductive layer 134 may be formed to have the upper surface positioned at substantially the same level as an upper surface of the semiconductor-based conductive layer 144.

Figure 4:
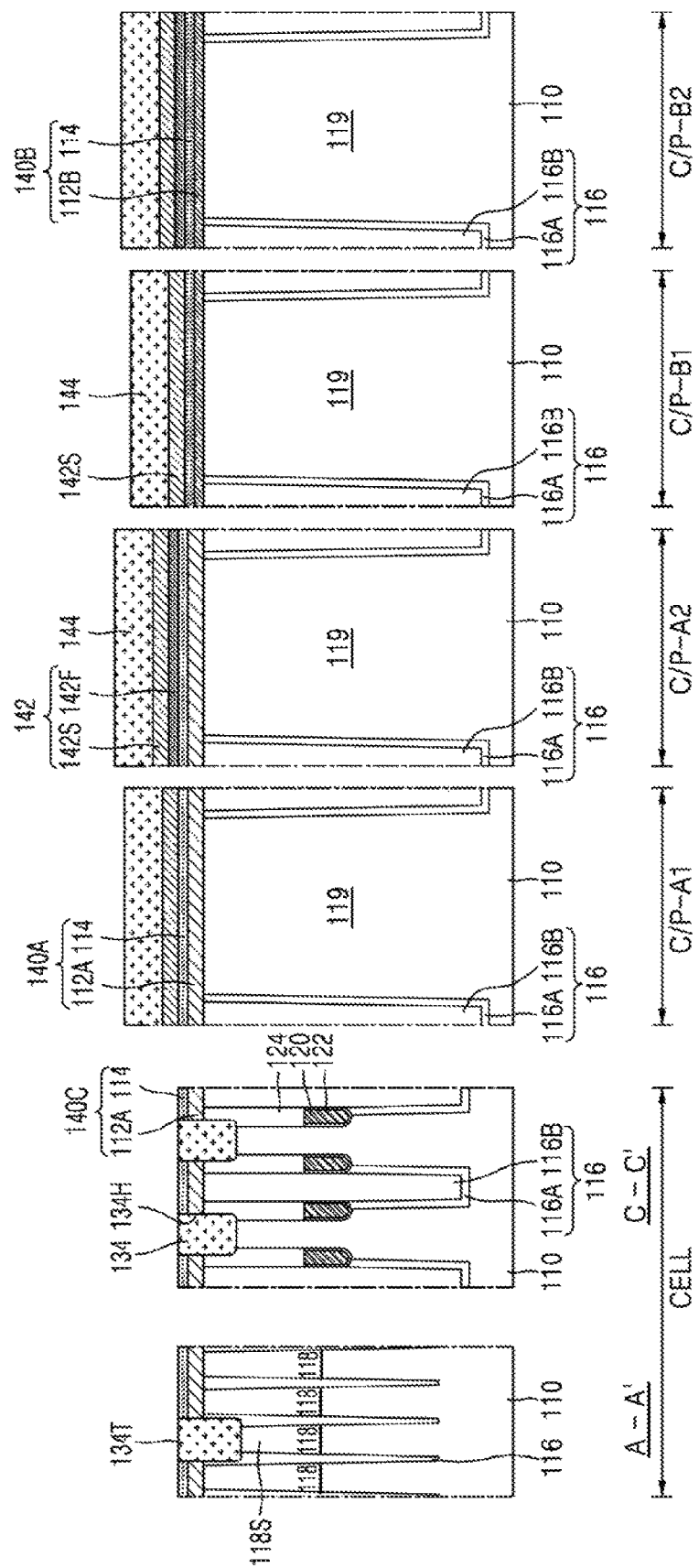

Referring to FIG. 4, in the cell array region CELL, the semiconductor-based conductive layer 144 and the first metal-based work function adjustment layer 142S may be removed to expose the cell insulating pattern 140C. The direct contact conductive layer 134 may have an upper surface 134T that is substantially coplanar with the upper surface of the cell insulating pattern 140C (e.g., an upper surface of the third insulating pattern 114).

When removing the semiconductor-based conductive layer 144 and the first metal-based work function adjustment layer 142S in the cell array region CELL, the first through fourth peripheral circuit regions C/P-A1, C/P-A2, C/P-B1 and C/P-B2 may be substantially covered by a mask layer such as a photoresist pattern. The mask layer may be removed after removing the semiconductor-based conductive layer 144 and the first metal-based work function adjustment layer 142S.

In some exemplary embodiments of the present inventive concept, in the cell array region CELL, the semiconductor-based conductive layer 144 may be removed by dry etching, and the first metal-based work function adjustment layer 142S may be removed by wet etching.

Figure 5:
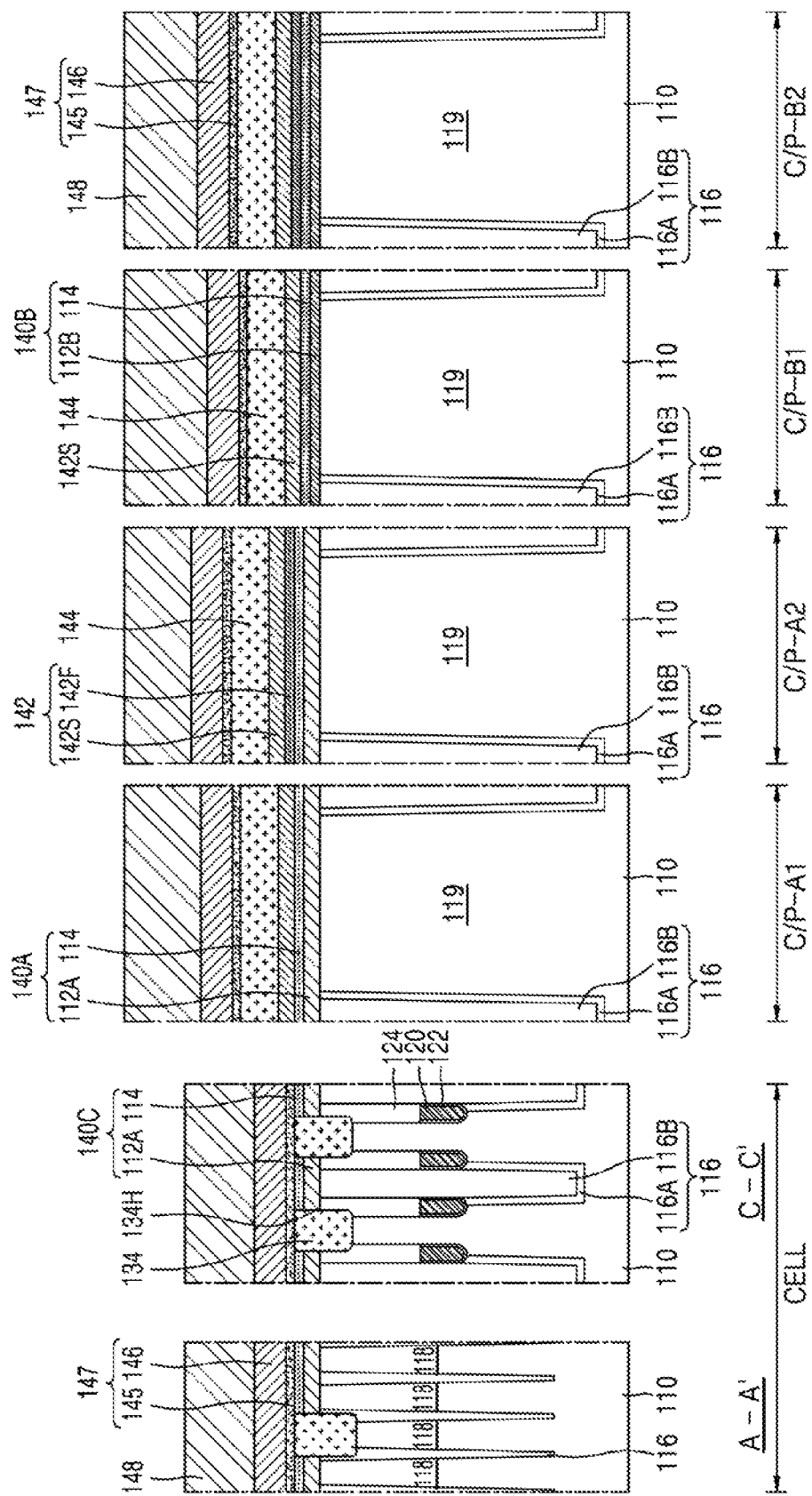

Referring to FIG. 5, a metal-based conductive layer 147 may be formed on the cell insulating pattern 140C and the direct contact conductive layer 134 in the cell array region CELL and may be formed on the semiconductor-based conductive layer 144 in the first through fourth peripheral circuit regions C/P-A1, C/P-A2, C/P-B1 and C/P-B2. The metal-based conductive layer 147 may be in direct contact with the cell insulating pattern 140C (e.g., the third insulating pattern 114 in the cell array region CELL).

In some exemplary embodiments of the present inventive concept, the metal-based conductive layer 147 may include a stack structure including a first metal-based conductive layer 145 and a second metal-based conductive layer 146. The metal-based conductive layer 147 may include a stack structure (e.g., a two-layered structure) including the first metal-based conductive layer 145 and the second metal-based conductive layer 146; however, exemplary embodiments of the present inventive concept are not limited thereto. For example, the metal-based conductive layer 147 may include a single conducive layer or a stack structure including three or more conductive layers.

In some exemplary embodiments of the present inventive concept, the first metal-based conductive layer 145 may include titanium nitride or titanium silicon nitride. The second metal-based conductive layer 146 may include tungsten or tungsten and tungsten silicide. In some exemplary embodiments of the present inventive concept, the first metal-based conductive layer 145 may be a diffusion barrier.

An insulating capping layer 148 may be formed on the metal-based conductive layer 147. In some exemplary embodiments of the present inventive concept, the insulating capping layer 148 may include silicon nitride.

Figure 6:
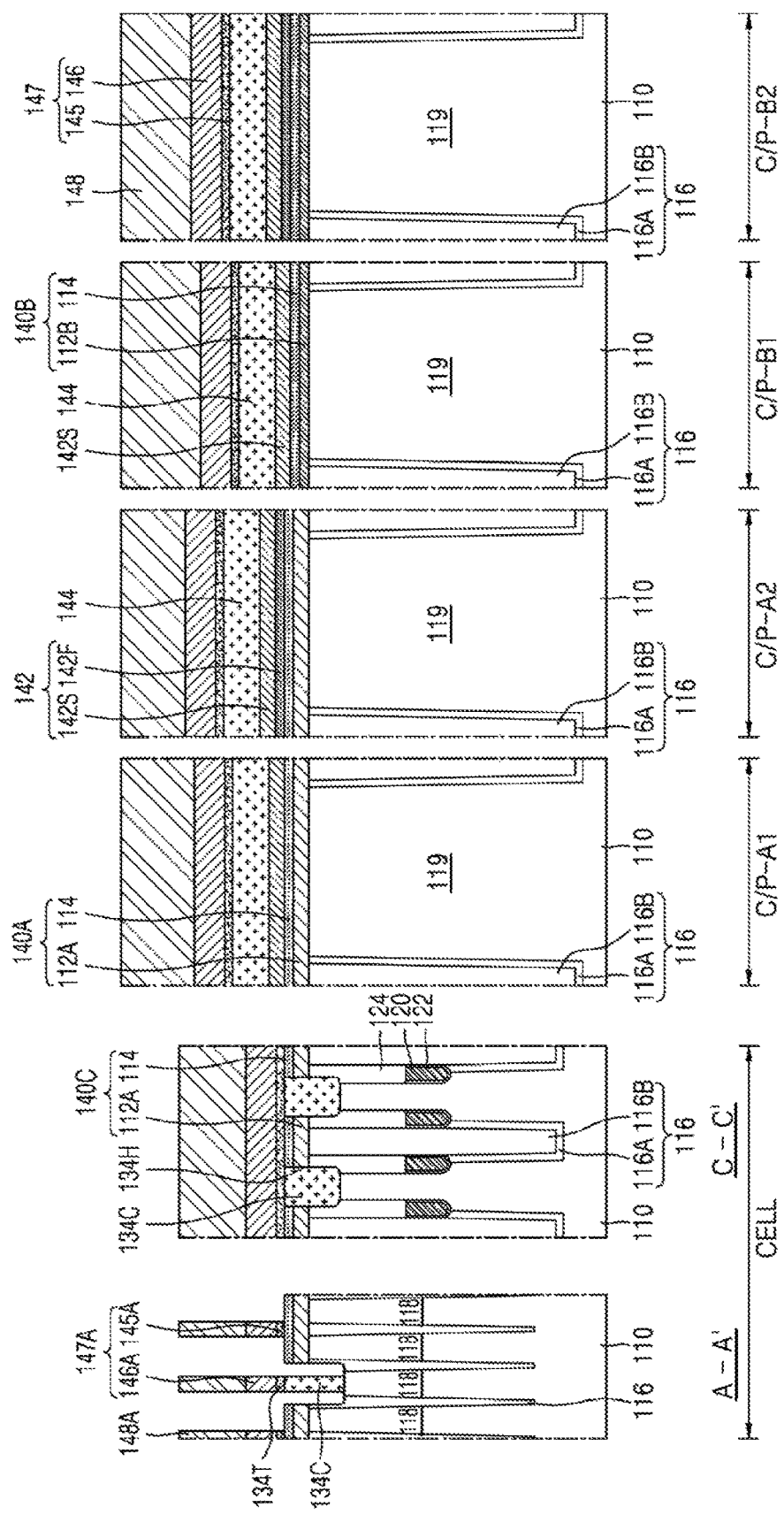

Referring to FIG. 6, the metal-based conductive layer 147 including the first metal-based conductive layer 145 and the second metal-based conductive layer 146 and the insulating capping layer 148 may be etched in the cell array region CELL to form a plurality of bit lines 147A which each include a first metal-based conductive pattern 145A and a second metal-based conductive pattern 146A with a linear shape and a plurality of insulating capping lines 148A. The first metal-based conductive pattern 145A may be in direct contact with the cell insulating pattern 140C (e.g., the third insulating pattern 114).

Figure 8:
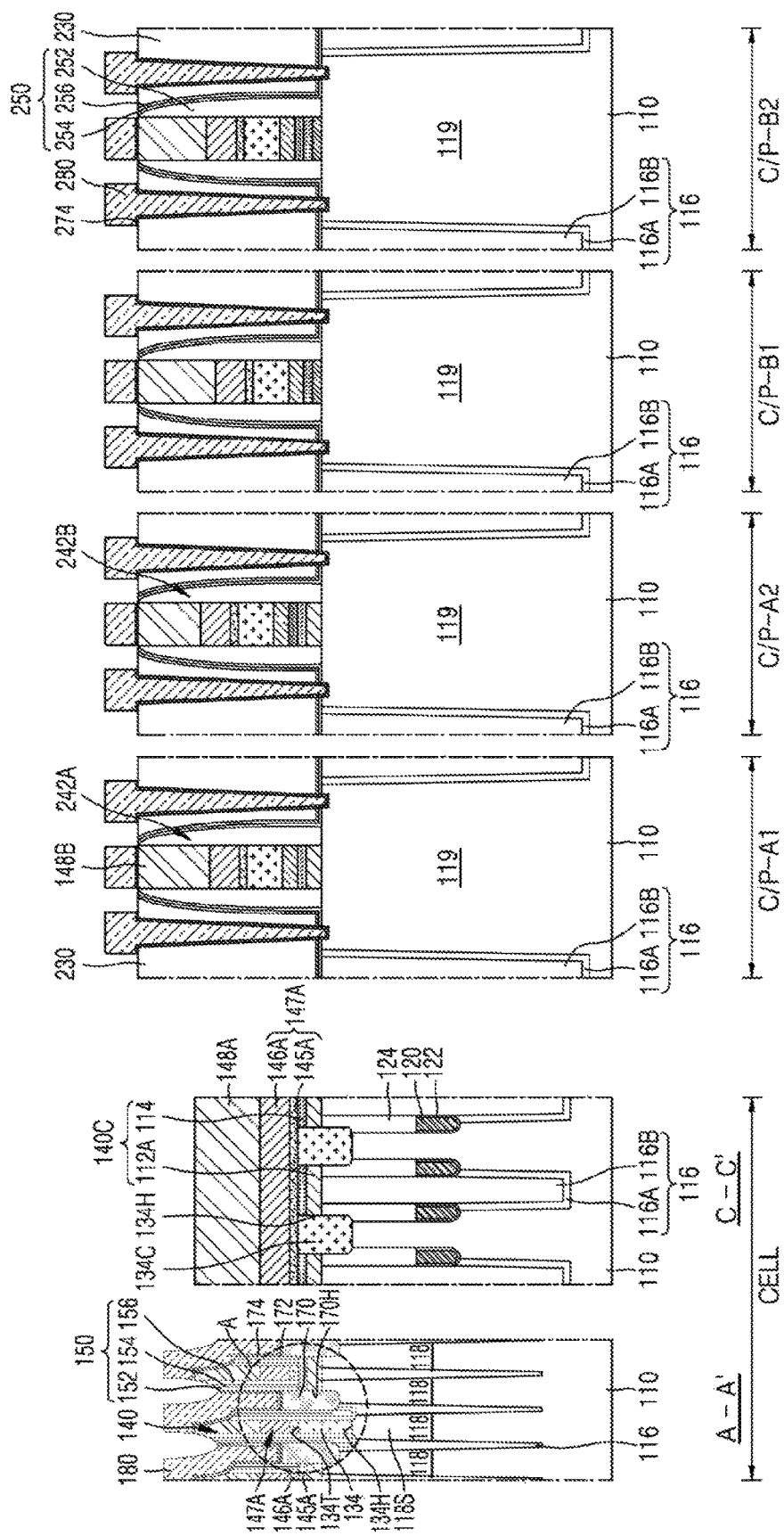

Each of the bit lines 147A and each of the insulating capping lines 148A covering each of the bit lines 147A may form a bit line structure 140 (see, e.g., FIG. 8).

The bit lines 147A and the insulating capping lines 148A may respectively extend in the second direction (e.g., the Y direction in FIG. 1) substantially in parallel with each other. The bit lines 147A may form the bit lines BL (see, e.g., FIG. 1).

During an etching process for forming the bit lines 147A, a portion of the direct contact conductive layers 134 (see, e.g., FIG. 5) spaced apart from the bit line 147A along a direction parallel to an upper surface of the substrate, and not overlapping with the bit line 147A may each be etched to form a direct contact conductive pattern 134C. The cell insulating pattern 140C may function as an etching stopper while the portion of the direct contact conductive layers 134 are etched. In some exemplary embodiments of the present inventive concept, the direct contact conductive patterns 134C may each include the upper surface 134T substantially coplanar with the upper surface of the cell insulating pattern 140C (e.g., the upper surface of the third insulating pattern 114).

As an example, when the third insulating pattern 114 includes a metal-based dielectric material and the direct contact conductive layer 134 includes doped polysilicon, the metal-based dielectric material may have a relatively high etching selectivity with respect to the doped polysilicon. When the first insulating pattern 112A includes a non-metal-based dielectric material such as silicon oxide and the direct contact conductive layer 134 includes doped polysilicon, the silicon oxide may have a relatively high etching selectivity with respect to the doped polysilicon.

In the process of forming the direct contact conductive pattern 134C by etching the direct contact conductive layer 134, the cell insulating pattern 140C may function as an etching stopper. Thus, even if the bit lines 147A do not include a same or similar material as the direct contact conductive pattern 134C, the direct contact conductive layer 134 may be etched using an etching mask used to form the bit lines 147A to form the direct contact conductive pattern 134C. The semiconductor-based conductive layer 144 may be removed (e.g., as described with reference to FIG. 4) such that a height or a distance from the upper surface of the cell insulating pattern 140C to the upper surface of the insulating capping layer 148 (see, e.g., FIG. 5) may be reduced.

Thus, a height of the bit line 147A may be reduced in comparison with a bit line structure in which the semiconductor-based conductive layer such as a doped polysilicon layer is included, such that bending of the bit line 147A may be reduced or prevented from occurring. In the case in which the bit line 147A include the semiconductor-based conductive layer such as the doped polysilicon layer, a necking phenomenon in which the semiconductor-based conductive layer becomes narrow in the process of forming the direct contact conductive pattern 134C may occur. However, the semiconductor-based conductive layer 144 may be removed in the cell array region CELL (e.g., as described with reference to FIG. 4) such that the necking phenomenon in the bit line 147A may be reduced or prevented from occurring.

Figure 7:
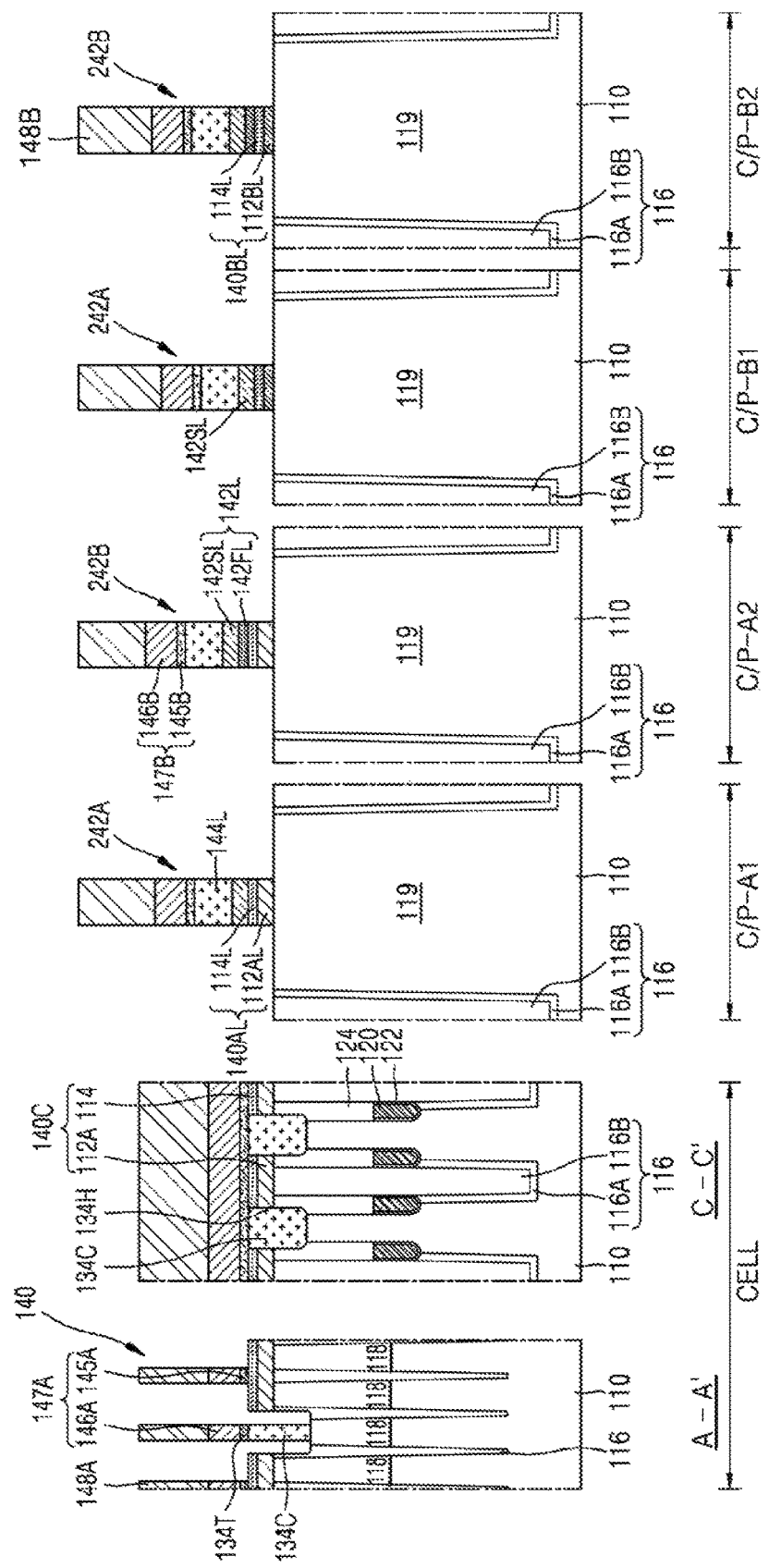

Referring to FIGS. 6 and 7, the first and second peripheral circuit gate insulating layers 140A and 140B, the first and second metal-based work function adjustment layers 142S and 142, the metal-based conductive layer 147 and the insulating capping layer 148 may be patterned in the first through fourth peripheral circuit regions C/P-A1, C/P-A2, C/P-B1 and C/P-B2, such that first and second peripheral circuit gate insulating layers 140AL and 140BL, first and second gate electrode structures 242A and 242B and a peripheral circuit insulating capping line 148B substantially covering the first and second gate electrode structures 242A and 242B may be formed.

The first peripheral circuit gate insulating layer 140AL may include a first insulating pattern 112AL and a third insulating pattern 114L. The second peripheral circuit gate insulating layer 140BL may include a second insulating pattern 112BL and the third insulating pattern 114L.

The first insulating pattern 112AL in the cell array region CELL and the first insulating patterns 112A in the first and second peripheral circuit regions C/P-A1 and C/P-A2 may be formed at substantially a same time and may include a same material. The second insulating pattern 112BL in the third peripheral circuit region C/P-B1 and the second insulating pattern 112BL in the fourth peripheral circuit region C/P-B2 may be formed at substantially a same time and may include a same material. The third insulating pattern 114L in the cell array region CELL and the third insulating patterns 114L in the first through fourth peripheral circuit regions C/P-A1, C/P-A2, C/P-B1 and C/P-B2 may be formed at substantially a same time and may include a same material.

The first gate electrode structure 242A may include a first metal-based work function adjustment pattern 142SL, a semiconductor conductive pattern 144L and a metal-based conductive pattern 147B including a first metal-based conductive pattern 145B and a second metal-based conductive pattern 146B. The second gate electrode structure 242B may include a second metal-based work function adjustment pattern 142L, the semiconductor conductive pattern 144L and the metal-based conductive pattern 147B including the first metal-based conductive pattern 145B and the second metal-based conductive pattern 146B. The second metal-based work function adjustment pattern 142L may include a stack structure of a subsidiary metal-based work function adjustment pattern 142FL and the first metal-based work function adjustment pattern 142SL.

In the first peripheral circuit region C/P-A1, the first peripheral circuit gate insulating layer 140AL, the first gate electrode structure 242A and the peripheral circuit insulating capping line 148B may be sequentially stacked. The first gate electrode structure 242A may be in direct contact with and may substantially cover the first peripheral circuit gate insulating layer 140AL in the first peripheral circuit region C/P-A1. In the second peripheral circuit region C/P-A2. The first peripheral circuit gate insulating layer 140AL, the second gate electrode structure 242B and the peripheral circuit insulating capping line 148B may be sequentially stacked. The second gate electrode structure 242B may be in direct contact with and may substantially cover the first peripheral circuit gate insulating layer 140AL in the second peripheral circuit region C/P-A2. In the third peripheral circuit region C/P-B1, the second peripheral circuit gate insulating layer 140BL, the first gate electrode structure 242A and the peripheral circuit insulating capping line 148B may be sequentially stacked. The first gate electrode structure 242A may be in direct contact with and may substantially cover the second peripheral circuit gate insulating layer 140BL in the third peripheral circuit region C/P-B1. In the fourth peripheral circuit region C/P-B2, the second peripheral circuit gate insulating layer 140BL, the second gate electrode structure 242B and the peripheral circuit insulating capping line 148B may be sequentially stacked. The second gate electrode structure 242B may be in direct contact with and may substantially cover the second peripheral circuit gate insulating layer 140BL in the fourth peripheral circuit region C/P-B1.

In the third peripheral circuit region C/P-B1, the first gate electrode structure 242A and the second peripheral circuit gate insulating layer 140BL may be referred to as a third gate electrode structure and a third peripheral circuit gate insulating layer, respectively. In the fourth peripheral circuit region C/P-B2, the second peripheral circuit gate insulating layer 140BL and the second gate electrode structure 242B may be referred to as a fourth peripheral circuit gate insulating layer and a fourth gate electrode structure, respectively.

The first metal-based work function adjustment patterns 142SL in the first through fourth peripheral circuit regions C/P-A1, C/P-A2, C/P-B1 and C/P-B2 may be formed from the first metal-based work function adjustment layer 142S (see, e.g., FIG. 2) and may include a same material as each other.

The subsidiary metal-based work function adjustment patterns 142FL in the second and fourth peripheral circuit regions C/P-A2 and C/P-B2 may be formed from the subsidiary metal-based work function adjustment layer 142F (see, e.g., FIG. 2) and may include a same material as each other. Thus, the second metal-based work function adjustment patterns 142L in the second and fourth peripheral circuit regions C/P-A2 and C/P-B2 may include a same material as each other.

The semiconductor conductive patterns 144L in the first through fourth peripheral circuit regions C/P-A1, C/P-A2, C/P-B1 and C/P-B2 may be formed from the semiconductor-based conductive layer 144 (see, e.g., FIG. 2) and may include a same material as each other.

The metal-based conductive pattern 147A (e.g., bit line) in the cell array region CELL and the metal-based conducive patterns 147B in the first through fourth peripheral circuit regions C/P-A1, C/P-A2, C/P-B1 and C/P-B2 may be formed from the metal-based conductive layer 147 (see, e.g., FIG. 5) and may include a same material as each other.

Referring to FIG. 8, a cell insulating spacer structure 150 may be formed on opposite sidewalls of each of the bit line structures 140 in the cell array region CELL. The cell insulating spacer structure 150 may substantially cover the opposite sidewalls of each of the bit line structures 140 in the cell array region CELL. A plurality of cell insulating spacer structures 150 may each include a first cell insulating spacer 152, a second cell insulating spacer 154 and a third cell insulating spacer 156. In some exemplary embodiments of the present inventive concept, the first through third cell insulating spacers 152, 154 and 156 may each include an oxide, nitride or a combination thereof. In some exemplary embodiments of the present inventive concept, the first and third cell insulating spacers 152 and 156 may each include an oxide, nitride or a combination thereof, and the second cell insulating spacer 154 between the first and third cell insulating spacers 152 and 156 may be an air spacer.

A plurality of buried contact holes 170H may be formed between each of bit lines 147A. The buried contact holes 170H may be defined by the cell insulating spacer structures 150 on facing sidewalls of two adjacent bit lines 147A and each of the cell active regions 118.

A plurality of buried contacts 170 and a plurality of landing pads 180 may be formed in the buried contact holes 170H, respectively, between each of the bit lines 147A. The plurality of buried contacts 170 and the plurality of landing pads 180 may each be connected to the cell active regions 118. The buried contacts 170 and the landing pads 180 may each be in positions corresponding to the buried contacts BC and the landing pads LP (see, e.g., FIG. 1).

The buried contacts 170 may each extend in the third direction (e.g., the Z direction in FIG. 1). The landing pads 180 may each be connected to the cell active regions 118 via the buried contacts 170.

The landing pads 180 may each be electrically connected to each of the buried contacts 170 and may each extend from the inside of each of the buried contact holes 170H over an upper surface of each of the bit line structures 140 to vertically overlap each of the bit line structures 140.

The landing pads 180 may each extend from a region between the bit lines 147A in the third direction (e.g., the Z direction in FIG. 1) to vertically overlap a portion of each of the bit lines 147A to cover at least a portion of the upper portion of each of the bit lines 147A.

A metal silicide layer 172 may be formed between each of the buried contacts 170 and each of the landing pads 180. The metal silicide layer 172 may include cobalt silicide, nickel silicide, manganese silicide, titanium silicide and/or tungsten silicide; however, exemplary embodiments of the present inventive concept are not limited thereto.

A first conductive barrier layer 174 may be formed between each of the landing pads 180 and each of the cell insulating spacer structures 150 and between each of the landing pads 180 and each of the bit line structures 140. The first conductive barrier layer 174 may include metal, conductive metal nitride or a combination thereof. For example, the first conductive barrier layer 174 may include a Ti/TiN stack structure.

In the first through fourth peripheral circuit regions C/P-A1, C/P-A2, C/P-B1 and C/P-B2, a peripheral insulating spacer structure 250 may be formed to substantially cover sidewalls of the first and second gate electrode structures 242A and 242B and the peripheral circuit insulating capping line 148B. The peripheral insulating spacer structure 250 may include a first peripheral insulating spacer 252, a second peripheral insulating spacer 254 and a third peripheral insulating spacer 256. The first peripheral insulating spacer 252, the second peripheral insulating spacer 254 and the third peripheral insulating spacer 256 may respectively include a same material as the first cell insulating spacer 152, the second cell insulating spacer 154 and the third cell insulating spacer 156 and may be formed at substantially a same time along with the first cell insulating spacer 152, the second cell insulating spacer 154 and the third cell insulating spacer 156, respectively.

In the first through fourth peripheral circuit regions C/P-A1, C/P-A2, C/P-B1 and C/P-B2, an insulating layer 230 may formed around (e.g., substantially surrounding side surfaces of) the first and second gate electrode structures 242A and 242B, the peripheral circuit insulating capping line 148B and the peripheral insulating spacer structure 250.

The insulating layer 230 may include silicon oxide, silicon nitride or a combination thereof.

After forming a mask pattern exposing a region in which a contact hole 270H is to be formed, on the insulating layer 230 in the first through fourth peripheral circuit regions C/P-A1, C/P-A2, C/P-B1 and C/P-B2, a portion of the insulating layer 230 may be etched using the mask pattern as an etching mask to form the contact hole 270H. The peripheral circuit active region 119 may be exposed through the contact hole 270H. In some exemplary embodiments of the present inventive concept, the contact hole 270H may be formed at substantially a same time as the buried contact hole 170H.

A second conductive barrier layer 274 may be formed on an inner surface of the contact hole 270H. The second conductive barrier layer 274 may be formed at substantially a same time as the first conductive barrier layer 174 in the cell array region CELL. The second conductive barrier layer 274 may include a same material as the first conductive barrier layer 174.

A conductive line 280 may be formed by depositing a conductive material on the second conductive barrier layer 274 in the first through fourth peripheral circuit regions C/P-A1, C/P-A2, C/P-B1 and C/P-B2. A plurality of conductive lines 280 may be formed. The conductive lines 280 in the first through fourth peripheral circuit regions C/P-A1, C/P-A2, C/P-B1 and C/P-B2 may each include a same material as the landing pads 180 in the cell array region CELL and may be formed at substantially the same time as the landing pads 180. The landing pads 180 and the conductive lines 280 may be formed by a chemical vapor deposition process or a physical vapor deposition process. In some exemplary embodiments of the present inventive concept, the landing pads 180 and the conductive lines 280 may each include metal, metal nitride or a combination thereof. For example, the landing pads 180 and the conductive lines 280 may include tungsten.

A conductive type of the peripheral circuit active region 119 under the first gate electrode structure 242A in the first peripheral circuit region C/P-A1 may be the same as a conductive type of the peripheral circuit active region 119 under the first gate electrode structure 242A in the third peripheral circuit region C/P-B1. A conductive type of the peripheral circuit active region 119 under the second gate electrode structure 242B in the second peripheral circuit region C/P-A2 may be the same as a conductive type of the peripheral circuit active region 119 under the second gate electrode structure 242B in the fourth peripheral circuit region C/P-B2.

In some exemplary embodiments of the present inventive concept, the conductive type of the peripheral circuit active region 119 under the first gate electrode structures 242A in the third peripheral circuit regions C/P-B1 may be different from the conductive type of the peripheral circuit active region 119 under the second gate electrode structures 242B in the second and fourth peripheral circuit regions C/P-A2 and C/P-B2.

Figure 9A:
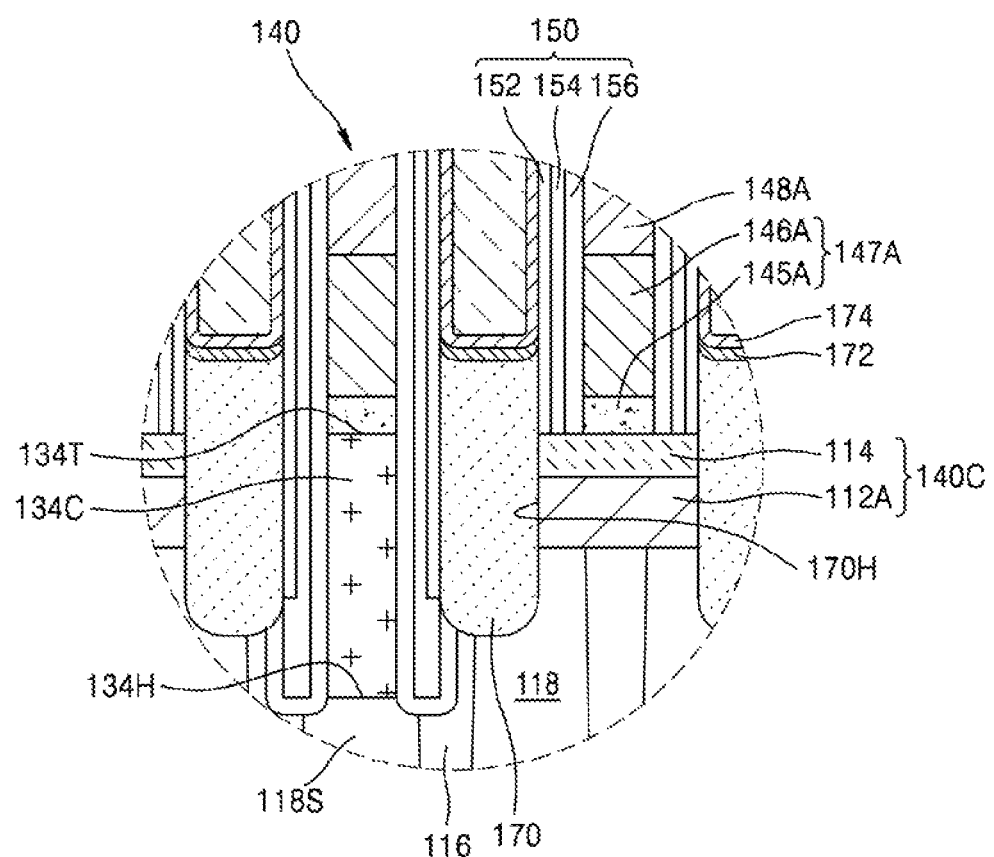
FIGS. 9A through 9C are enlarged views illustrating portion A of FIG. 8 according to an exemplary embodiment of the present inventive concept.
Figure 9B:
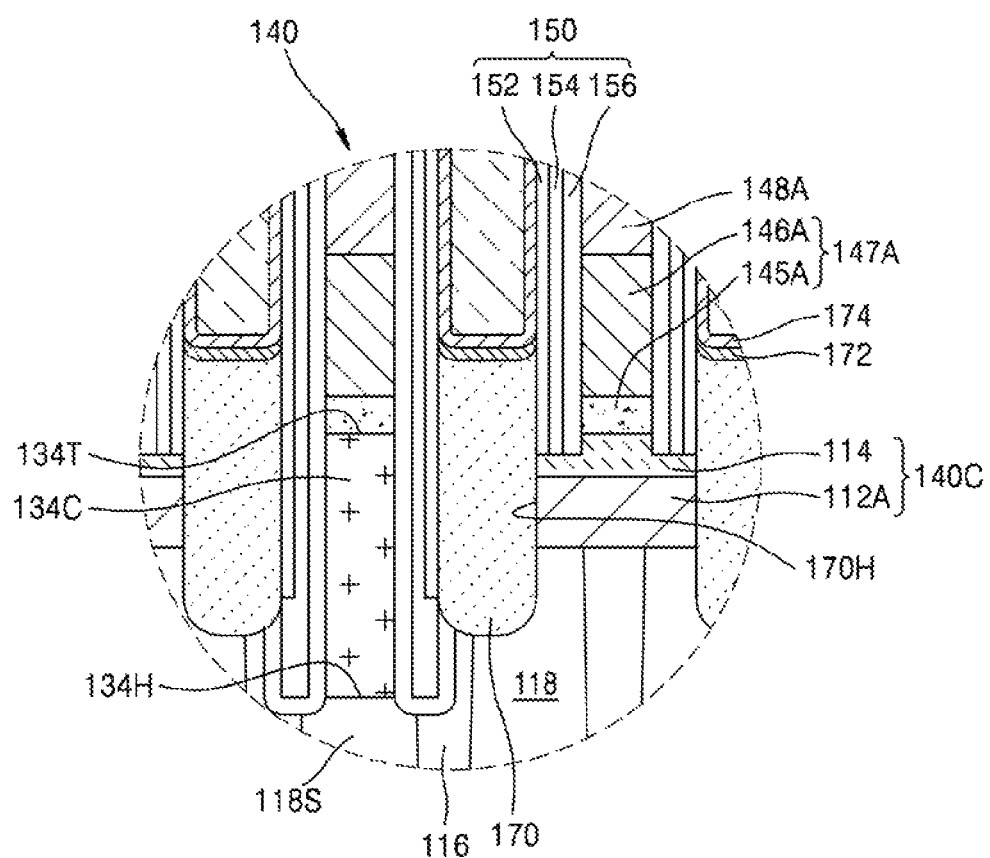
Figure 9C:
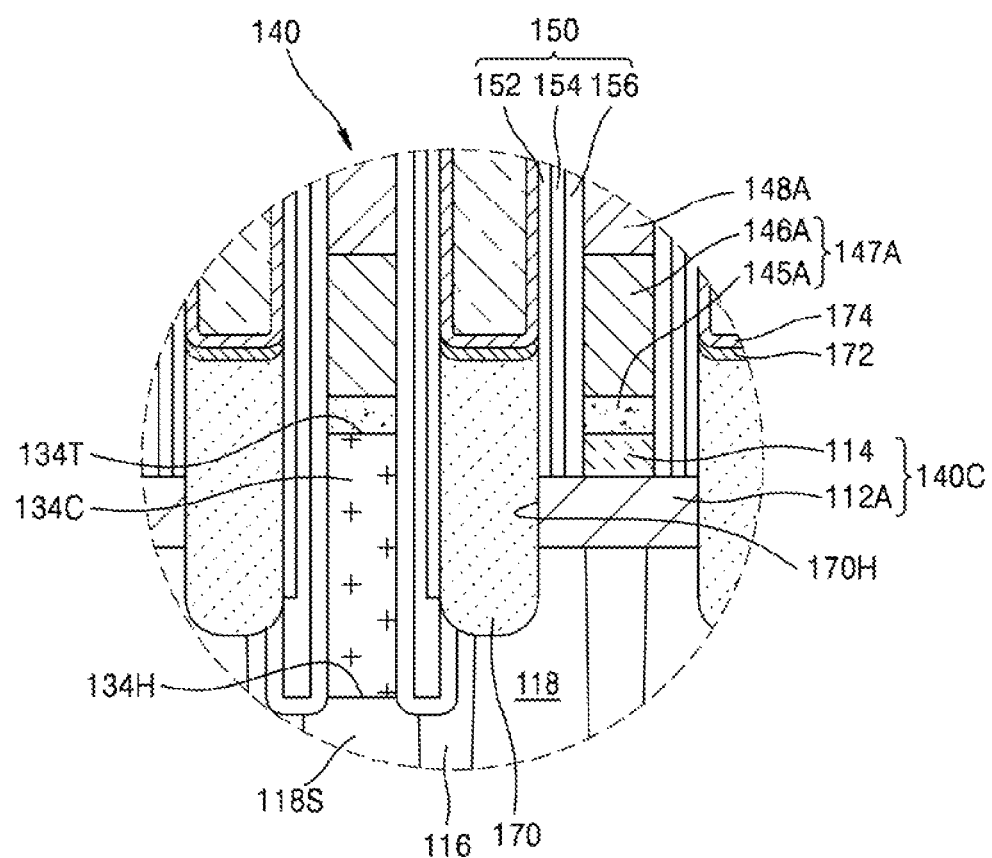

FIGS. 9A through 9C are enlarged views illustrating portion A of FIG. 8 according to an exemplary embodiment of the present inventive concept.

Referring to FIG. 9A, the first insulating pattern 112A and the third insulating pattern 114 of the cell insulating pattern 140C may overlap with each other along a direction orthogonal to an upper surface of the substrate 110. The first insulating pattern 112A and the third insulating pattern 114 may have substantially the same planar shape and may vertically overlap with each other.

An upper surface of a portion of the third insulating pattern 114 under the bit line 147A may be substantially coplanar with an upper surface of a portion of the third insulating pattern 114 not overlapping the bit line 147A along a direction orthogonal to an upper surface of the third insulating pattern 114. The third insulating pattern 114 may include an upper surface having a first portion under the bit line 147A and a second portion under the cell insulating spacer structure 150, which is substantially coplanar with the first portion.

The upper surface 134T of the direct contact conductive pattern 134C may be substantially coplanar with an upper surface of the cell insulating pattern 140C (e.g., the upper surface of the third insulating pattern 114).

Referring to FIG. 9B, the first insulating pattern 112A and the third insulating pattern 114 of the cell insulating pattern 140C may overlap with each other along a direction orthogonal to an upper surface of the first insulating pattern 112A. The first insulating pattern 112A and the third insulating pattern 114 may have substantially a same planar shape as each other, and may vertically overlap with each other along the direction orthogonal to the upper surface of the first insulating pattern 112A.

In the etching process of forming the bit line 147A and the direct contact conductive pattern 134C, a portion of the third insulating pattern 114 may be removed. In this case, an upper surface of a portion of the third insulating pattern 114 under the bit line 147A may be positioned at a higher level than an upper surface of the other portion thereof. The third insulating pattern 114 may include the upper surface including a first portion under the bit line 147A and a second portion under the cell insulating spacer structure 150, which is lower than the first portion.

The cell insulating spacer structure 150 on the opposite sidewalls of the bit line 147A may further extend toward the substrate 110 (see, e.g., FIG. 8) than the bit line 147A.

Referring to FIG. 9C, a portion of the first insulating pattern 112A of the cell insulating pattern 140C may overlap with a portion of the third insulating pattern 114 thereof along a direction orthogonal to an upper surface of the first insulating pattern 112A.

In the etching process of forming the bit line 147A and the direct contact conductive pattern 134C, a portion of the third insulating pattern 114 may be removed. For example, portions of the third insulating pattern 114 other than a portion thereof under the bit line 147A may be removed to expose the first insulating pattern 112A.

The first insulating pattern 112A may be positioned under the bit line 147A and the cell insulating spacer structure 150 to vertically overlap with the bit line 147A and the cell insulating spacer structure 150, and the third insulating pattern 114 may be positioned at only a position vertically overlapping with the bit line 147A. The first insulating pattern 112A may extend in opposite lateral directions from the portion overlapping with the bit line 147A.

The cell insulating spacer structure 150 on the opposite sidewalls of the bit line 147A may further extend toward the substrate 110 (see, e.g., FIG. 8) than the bit line 147A, and may be in direct contact with the first insulating pattern 112A.

In some exemplary embodiments of the present inventive concept, the first insulating pattern 112A may include an upper surface having a first portion under bit line 147A and a second portion that is not under the bit line 147A and is substantially coplanar with the first portion, In some exemplary embodiments of the present inventive concept, in the etching process of forming the bit line 147A and the direct contact conductive pattern 134C, a portion of the first insulating pattern 112A may be removed such that an upper surface of a portion of the first insulating pattern 112A under the cell insulating spacer structure 150 may be positioned at a lower level than an upper surface of the other portion thereof under the bit line 147A.

Figure 10:
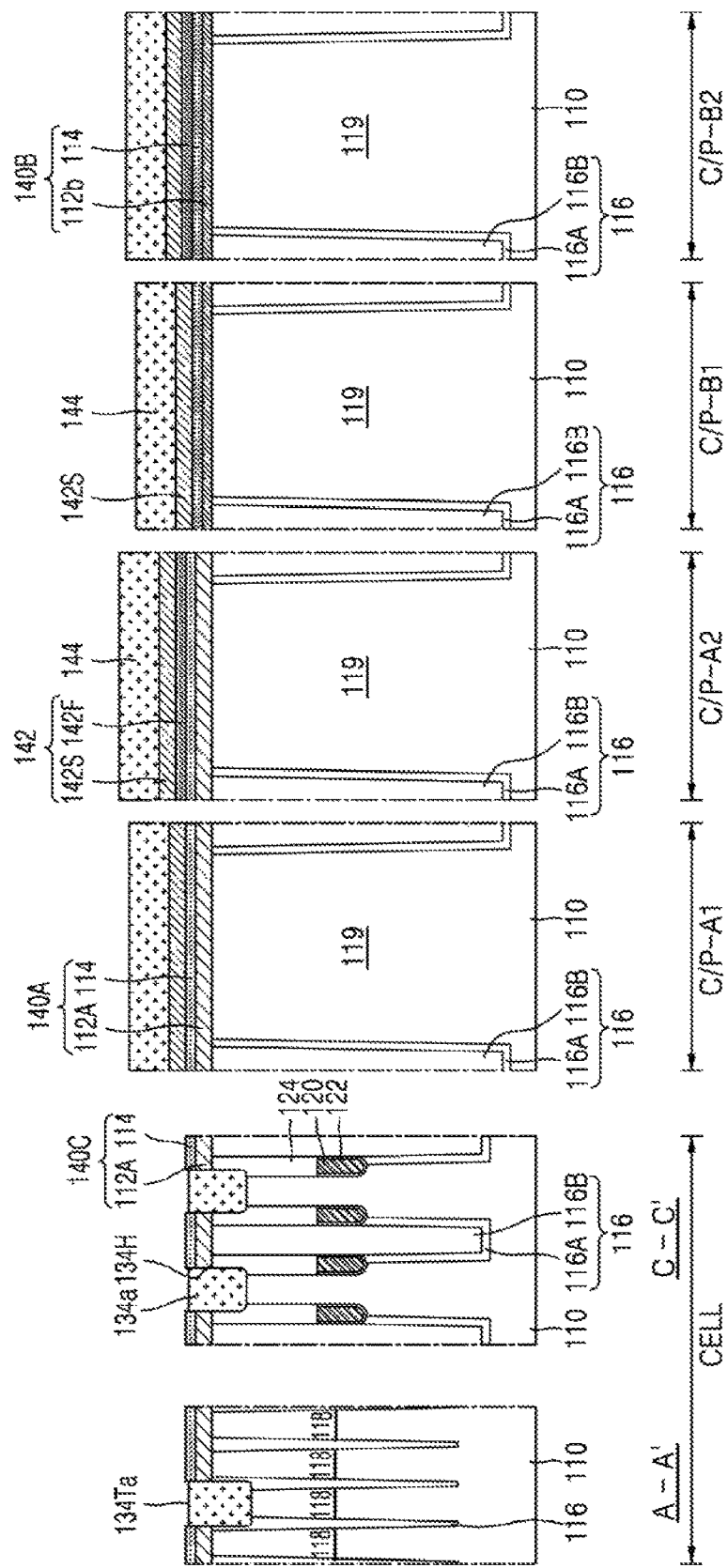
FIG. 10 is a cross-sectional view illustrating a method of manufacturing a semiconductor device according to an exemplary embodiment of the present inventive concept.

FIG. 10 is a cross-sectional view illustrating a method of manufacturing a semiconductor device according to an exemplary embodiment of the present inventive concept. FIG. 10 illustrates a method of manufacturing a semiconductor device after FIG. 3

Referring to FIG. 10, in the cell array region CELL, the semiconductor-based conductive layer 144 and the first metal-based work function adjustment layer 142S may be removed to expose the cell insulating pattern 140C. In this case, a portion of an upper portion of the direct contact conductive layer 134 (see, e.g., FIG. 3) may be removed. Thus, an upper surface 134Ta of a remaining direct contact conductive layer 134a may be positioned at a lower level than the upper surface of the third insulating pattern 114.

Next, the same or similar processes of manufacturing the semiconductor device as described with reference to FIGS. 5 through 8 may be performed.

Figure 11A:
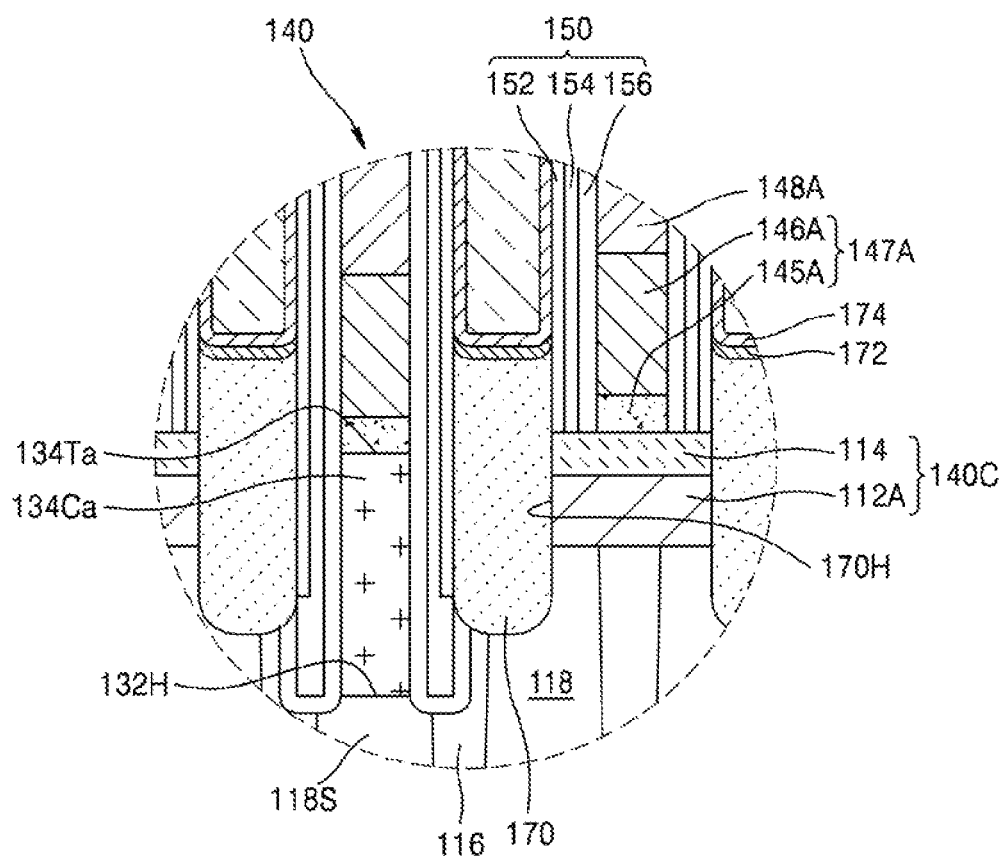
FIGS. 11A and 11C are enlarged views illustrating a portion of a semiconductor device manufactured using a method according to an exemplary embodiment of the present inventive concept and are enlarged views illustrating a portion corresponding to the portion A of FIG. 8.
Figure 11B:
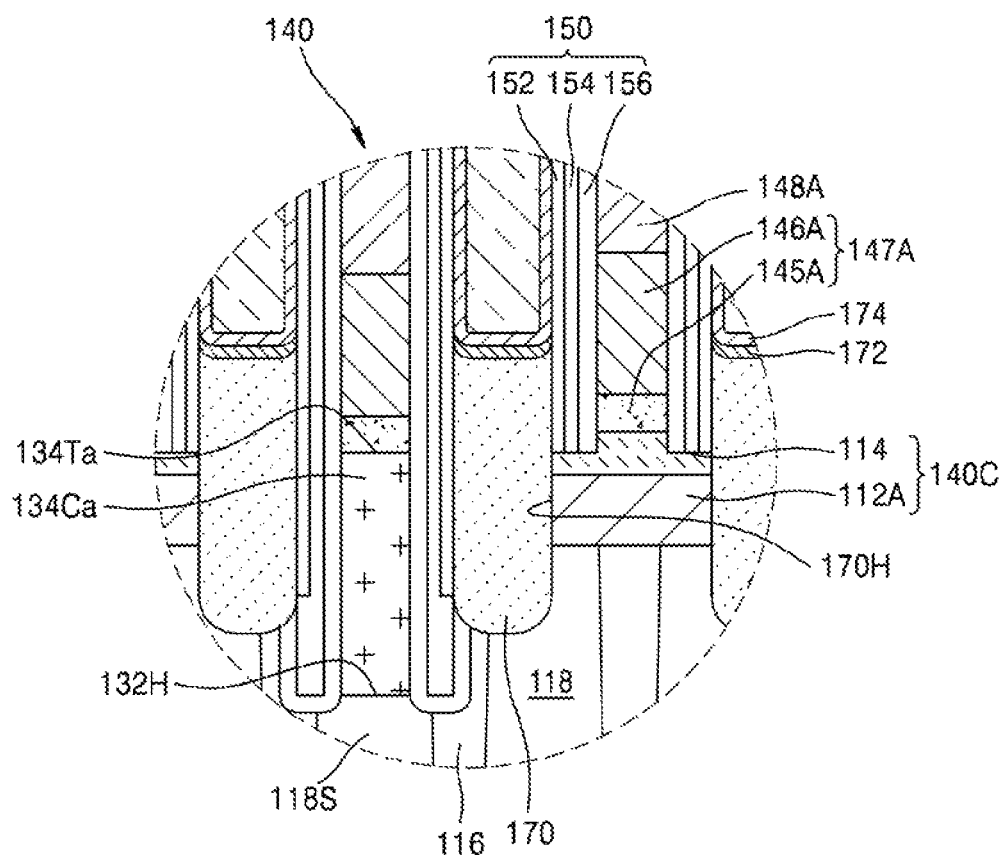
Figure 11C:
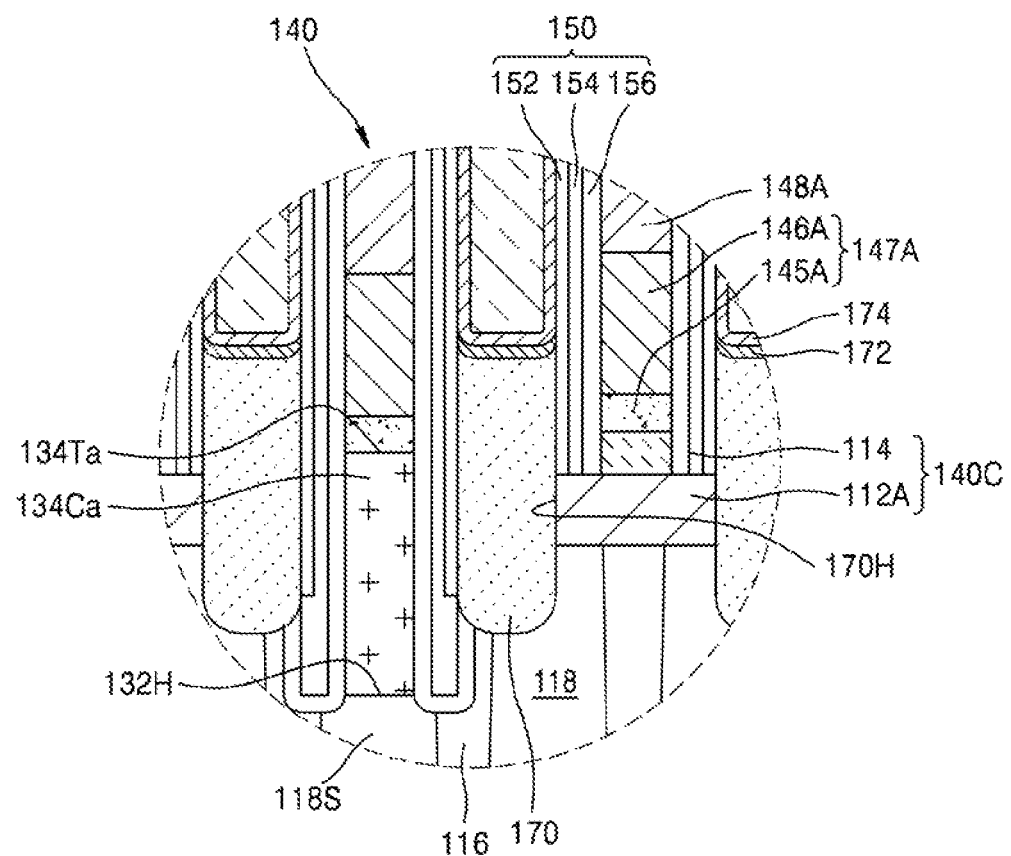

FIGS. 11A and 11C are enlarged views illustrating a portion of a semiconductor device manufactured using a method according to an exemplary embodiment of the present inventive concept and are enlarged views illustrating a portion corresponding to the portion A of FIG. 8.

FIGS. 11A and 11C are enlarged views illustrating a portion of a semiconductor device manufactured using the method described in FIG. 10 according to an exemplary embodiment of the present inventive concept and are enlarged views illustrating the portion corresponding to the portion A of FIG. 8.

Referring to FIG. 11A, the first insulating pattern 112A and the third insulating pattern 114 of the cell insulating pattern 140C may overlap with each other along a direction orthogonal to an upper surface of the first insulating pattern 112A. The first insulating pattern 112A and the third insulating pattern 114 may have substantially the same planar shape and may vertically overlap with each other along the direction orthogonal to the upper surface of the first insulating pattern 112A.

An upper surface of a portion of the third insulating pattern 114 under the bit line 147A may be substantially coplanar with an upper surface of the other portion thereof. The third insulating pattern 114 may include the upper surface including a first portion under the bit line 147A and a second portion under the cell insulating spacer structure 150, which may be substantially coplanar with the first portion.

The upper surface 134Ta of the direct contact conductive pattern 134Ca may be positioned at a lower level than an upper surface of the cell insulating pattern 140C (e.g., the upper surface of the third insulating pattern 114).

Referring to FIG. 11B, the first insulating pattern 112A and the third insulating pattern 114 of the cell insulating pattern 140C may overlap with each other along the direction orthogonal to the upper surface of the first insulating pattern 112A. The first insulating pattern 112A and the third insulating pattern 114 may have substantially the same planar shape and may vertically overlap with each other along the direction orthogonal to the upper surface of the first insulating pattern 112A.

In the etching process of forming the bit line 147A and the direct contact conductive pattern 134Ca, a portion of the third insulating pattern 114 may be removed. Thus, an upper surface of a portion of the third insulating pattern 114 under the bit line 147A may be positioned at a higher level than an upper surface of the other portion thereof. The third insulating pattern 114 may include a first upper surface under the bit line 147A and a second upper surface that is under the cell insulating spacer structure 150 and is positioned at a lower level than the first upper surface.

The cell insulating spacer structure 150 on the opposite sidewalls of the bit line 147A may further extend toward the substrate 110 (see, e.g., FIG. 8) than the bit line 147A.

The upper surface 134Ta of the direct contact conductive pattern 134Ca may be positioned at a lower level than an upper surface of the cell insulating pattern 140C (e.g., the upper surface of the third insulating pattern 114).

Referring to FIG. 11C, the first insulating pattern 112A and the third insulating pattern 114 of the cell insulating pattern 140C may overlap with each other along the direction orthogonal to the upper surface of the first insulating pattern 112A.

In the etching process of forming the bit line 147A and the direct contact conductive pattern 134Ca, a portion of the third insulating pattern 114 may be removed. Thus, portions of the third insulating pattern 114 other than a portion thereof under the bit line 147A may be removed to expose the first insulating pattern 112A.

Thus, the first insulating pattern 112A may be positioned under the bit line 147A and the cell insulating spacer structure 150. The third insulating pattern 114 may be positioned only under the bit line 147A. The first insulating pattern 112A and the third insulating pattern 114 may overlap with each other only under the bit line 147A, and the first insulating pattern 112A may be present at opposite sides of the bit line 147A. The first insulating pattern 112A may extend in opposite lateral directions from the portion overlapping with the bit line 147A.

The cell insulating spacer structure 150 on the sidewalls of the bit line 147A may further extend toward the substrate 110 (see, e.g., FIG. 8) than the bit line 147A to contact the first insulating pattern 112A.

In some exemplary embodiments of the present inventive concept, the first insulating pattern 112A may include an upper surface including a first portion under bit line 147A and a second portion that is not under the bit line 147A and is substantially coplanar with the first portion, In some exemplary embodiments of the present inventive concept, in the etching process of forming the bit line 147A and the direct contact conductive pattern 134Ca, a portion of the first insulating pattern 112A may be removed such that an upper surface of a portion of the first insulating pattern 112A under the cell insulating spacer structure 150 may be positioned at a lower level than an upper surface of the other portion thereof under the bit line 147A.

The upper surface 134Ta of the direct contact conductive pattern 134Ca may be positioned at a lower level than the upper surface of the cell insulating pattern 140C (e.g., the upper surface of the third insulating pattern 114).

FIGS. 12 through 16 are cross-sectional views illustrating stages of a method of manufacturing a semiconductor device according to an exemplary embodiment of the present inventive concept. FIGS. 12 through 16 illustrate a method of manufacturing a semiconductor device after FIG. 3.

Figure 12:
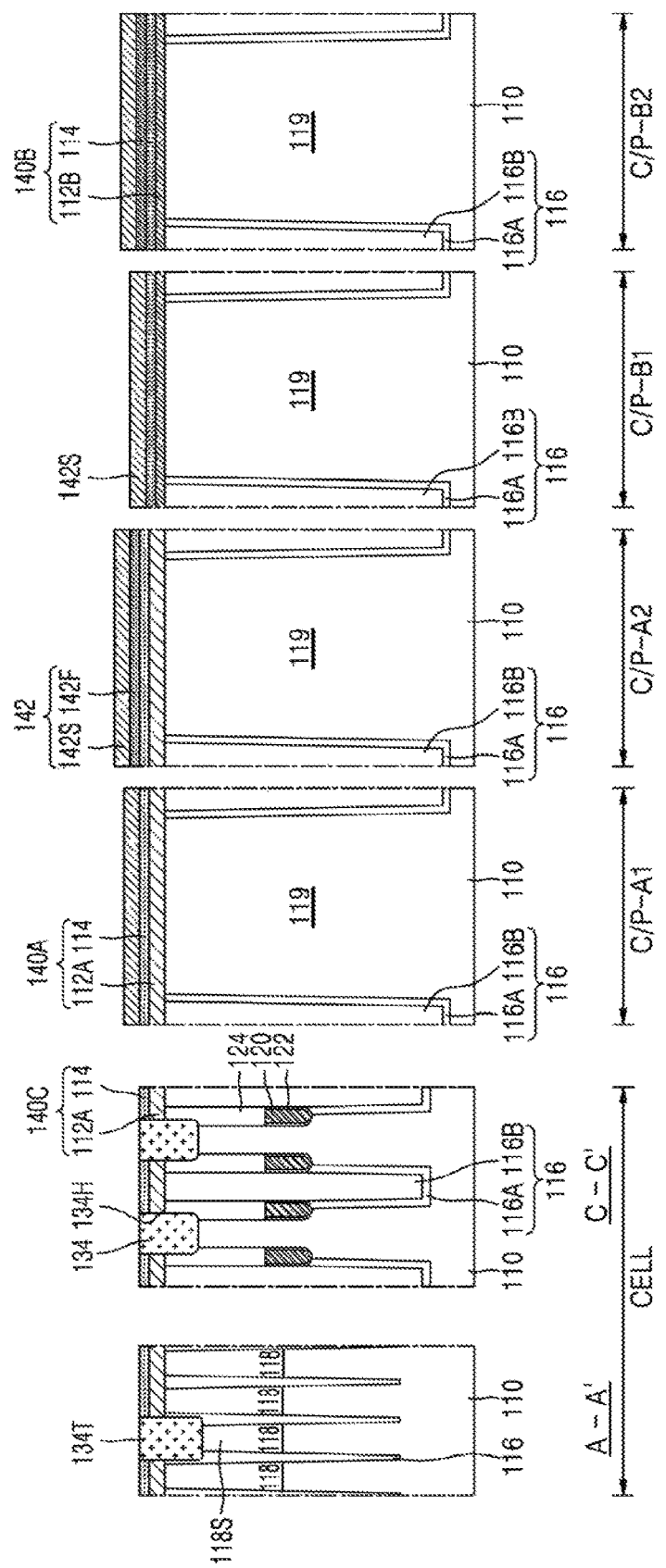
FIGS. 12 through 16 are cross-sectional views illustrating stages of a method of manufacturing a semiconductor device according to an exemplary embodiment of the present inventive concept.

Referring to FIG. 12, the semiconductor-based conductive layer 144 (see, e.g., FIG. 3) may be removed in the first cell array region CELL and the first through fourth peripheral circuit regions C/P-A1, C/P-A2, C/P-B1 and C/P-B2 to expose the first metal-based work function adjustment layer 142S in the first and third peripheral circuit regions C/P-A1 and C/P-B1 and the second metal-based work function adjustment layer 142 in the second and fourth peripheral circuit regions C/P-A2 and C/P-B2.

Additionally, the first metal-based work function adjustment layer 142S may be further removed in the cell array region CELL to expose the cell insulating pattern 140C, and the direct contact conductive layer 134 may be formed to fill the direct contact hole 134H in the cell array region CELL.

In the process of removing the first metal-based work function adjustment layer 142S, the first through peripheral circuit regions C/P-A1, C/P-A2, C/P-B1 and C/P-B2 may be substantially covered by a mask layer such as a photoresist pattern. The mask layer may be removed after the removal of the first-metal-based work function adjustment layer 142S in the cell array region CELL.

Figure 13:
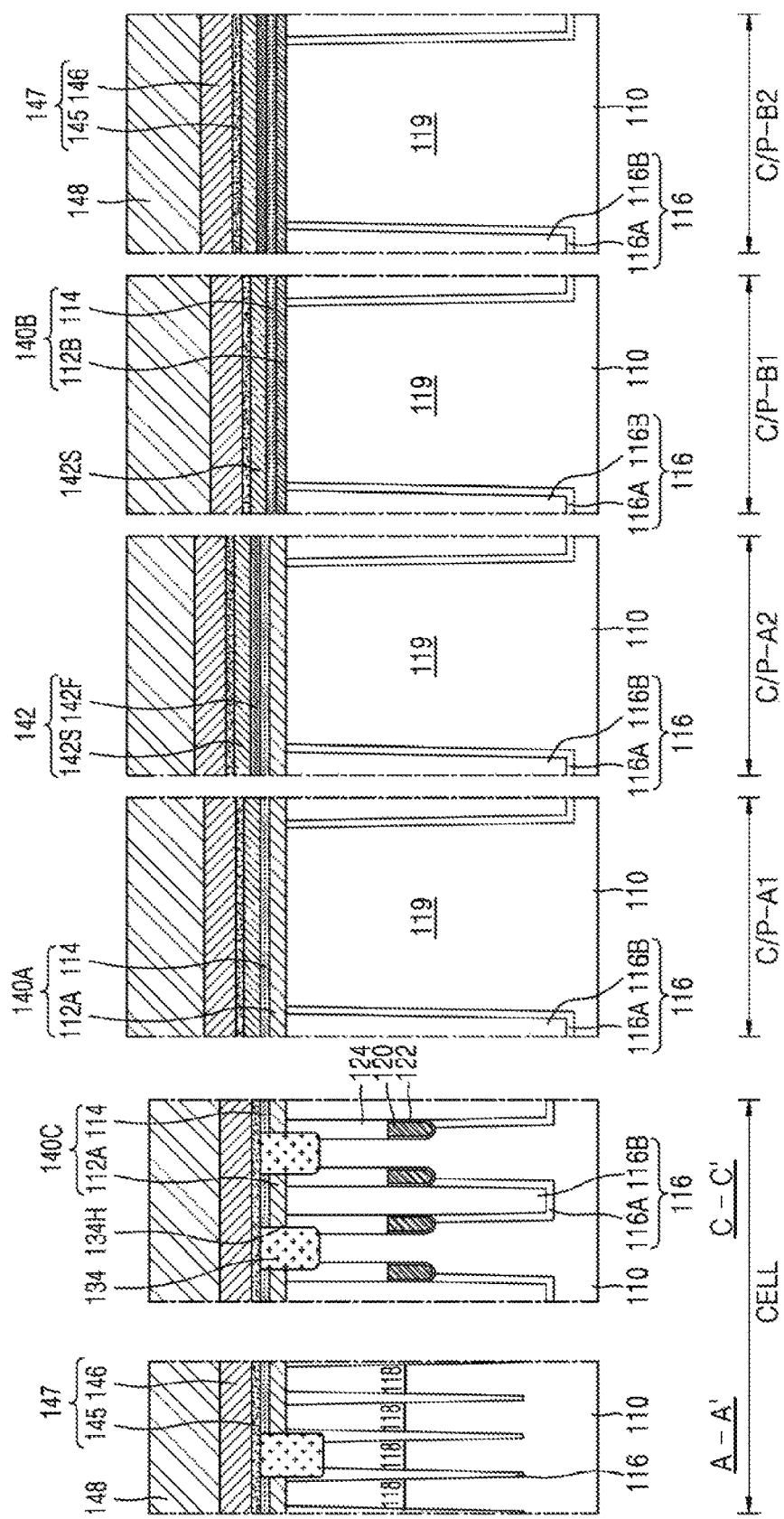

Referring to FIG. 13, the metal-based conductive layer 147 may substantially cover the cell insulating pattern 140C and the direct contact conductive layer 134 in the cell array region CELL, the first metal-based work function adjustment layer 142S in the first and third peripheral circuit regions C/P-A1 and C/P-B1, and the second metal-based work function adjustment layer 142 in the second and fourth peripheral circuit regions C/P-A2 and C/P-B2. The metal-based conductive layer 147 may include the first metal-based conductive layer 145 and the second metal-based conductive layer 146. The metal-based conductive layer 147 (e.g., the first metal-based conductive layer 145) may be in direct contact with the cell insulating pattern 140C and the direct contact conductive layer 134 in the cell array region CELL, the first metal-based work function adjustment layer 142S in the first and third peripheral circuit regions C/P-A1 and C/P-B1 and the second metal-based work function adjustment layer 142 in the second and fourth peripheral circuit regions C/P-A2 and C/P-B2. The insulating capping layer 148 may be formed on the metal-based conductive layer 147.

Figure 14:
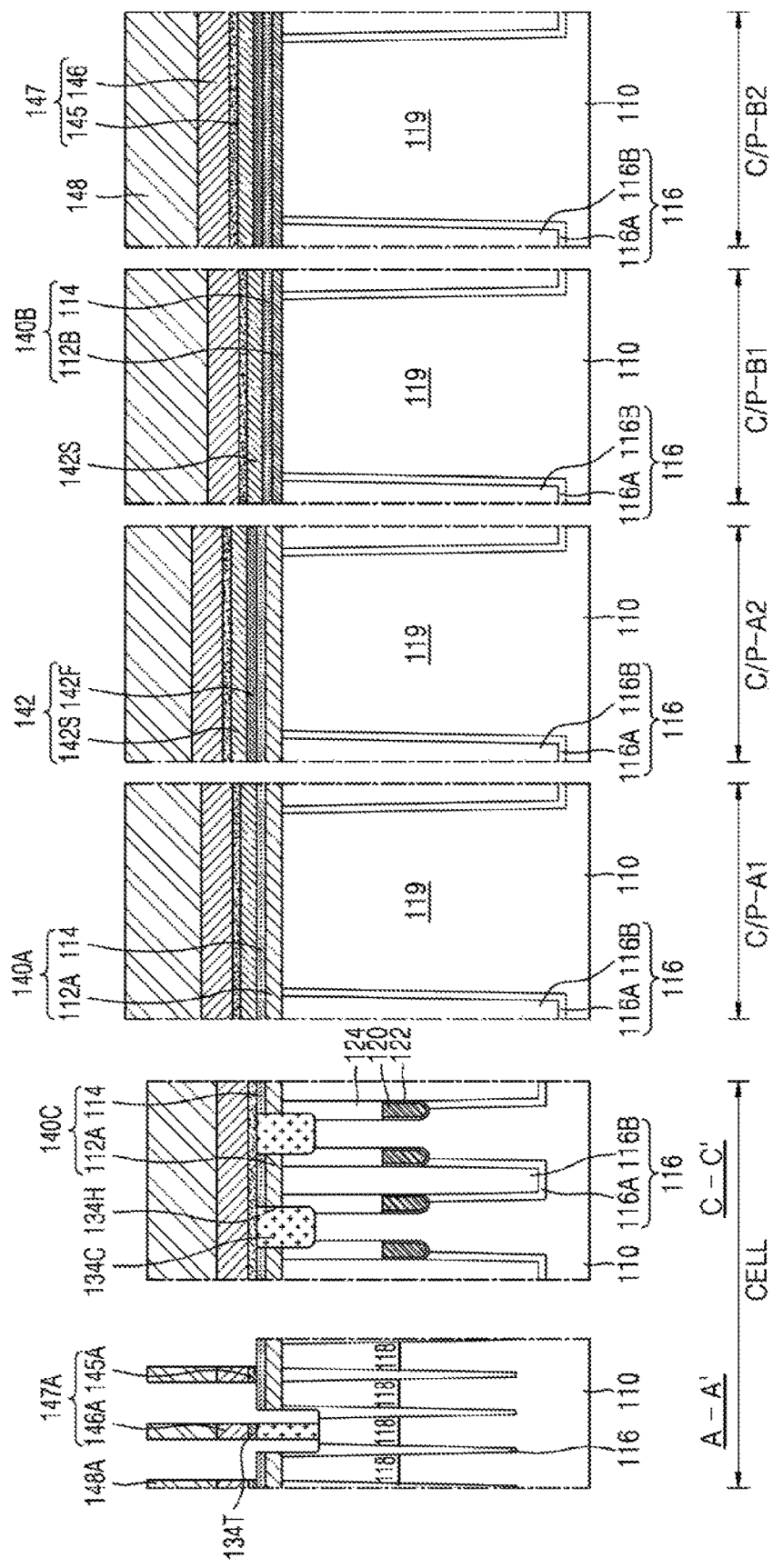

Referring to FIG. 14, the metal-based conductive layer 147 and the insulating capping layer 148 may be etched in the cell array region CELL to form a plurality of bit lines 147A and a plurality of insulating capping lines 148A. The bit lines 147A may each include the first metal-based conductive pattern 145A and the second metal-based conductive pattern 146A which each have a linear shape.

Each bit line structure 140 may include the bit line 147A and the insulating capping line 148A covering each bit line 147A.

Figure 15:
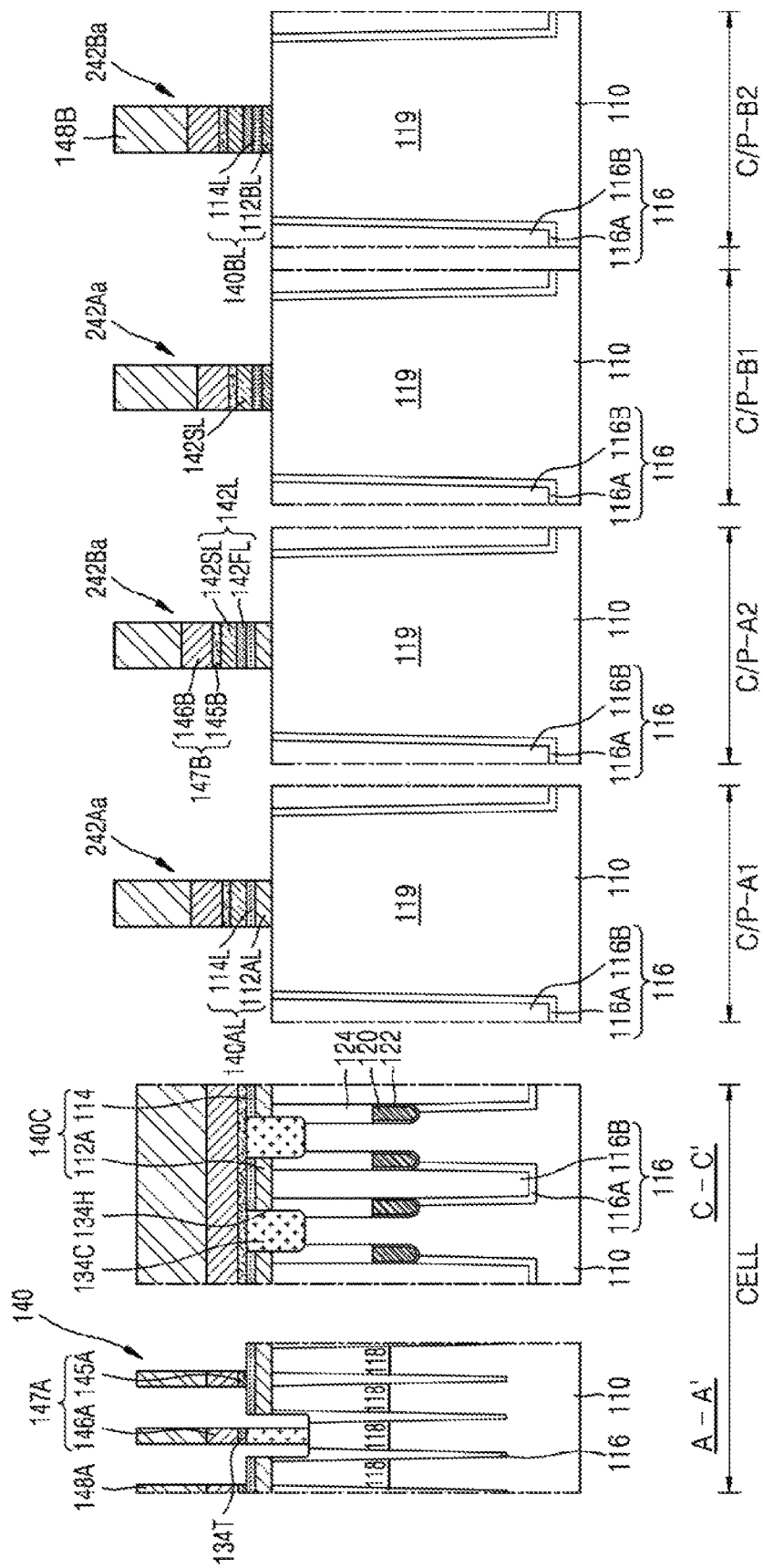

Referring to FIG. 15, the first and second peripheral circuit gate insulating layers 140A and 140B, the first and second metal-based work function adjustment layers 142S and 142, the metal-based conductive layer 147 and the insulating capping layer 148 may be patterned in the first through fourth peripheral circuit regions C/P-A1, C/P-A2, C/P-B1 and C/P-B2 to form first and second peripheral circuit gate insulating layers 140AL and 140BL, first and second gate electrode structures 242Aa and 242Ba and the peripheral circuit insulating capping line 148B covering the first and second gate electrode structures 242Aa and 242Ba.

In the first gate electrode structure 242Aa, the first metal-based conductive pattern 145B may be in direct contact with a first metal-based work function adjustment pattern 142SL. In the second gate electrode structure 242Ba, the first metal-based conductive pattern 145B may be in direct contact with a second metal-based work function adjustment pattern 142L.

Figure 16:
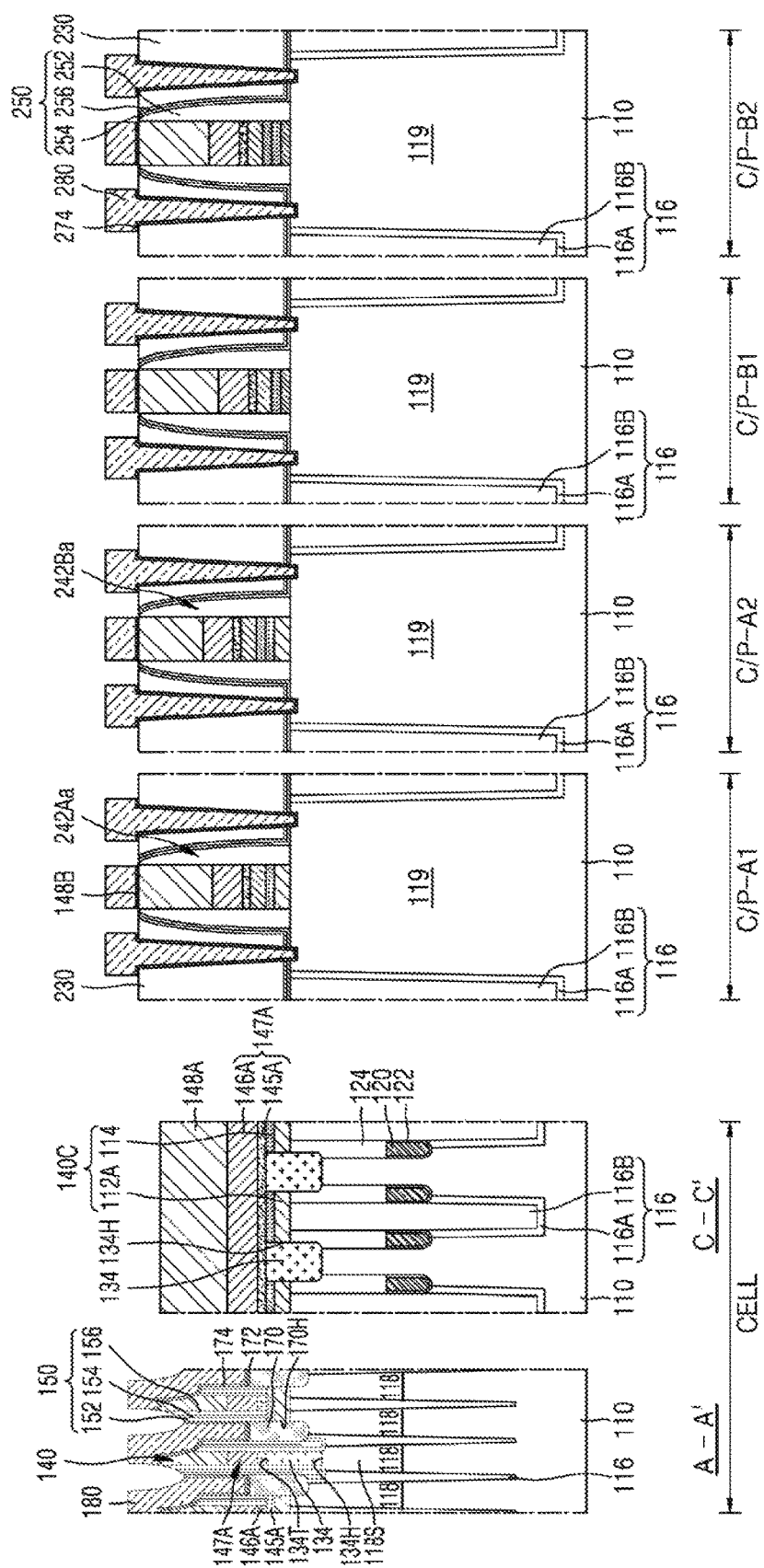

Referring to FIG. 16, a cell insulating spacer structure 150 may be formed on opposite sidewalls of each of the bit line structures 140 in the cell array region CELL. A plurality of cell insulating spacer structures 150 may each include the first cell insulating spacer 152, the second cell insulating spacer 154 and the third cell insulating spacer 156.

A plurality of insulating patterns and a plurality of buried contact holes 170H defined by the insulating patterns may be formed between each of the bit lines 147A. A plurality of buried contacts 170 and a plurality of landing pads 180 may be formed in the buried contact holes 170H, respectively. The buried contacts 170 may be connected to the cell active region 118, respectively.

A metal silicide layer 172 may be formed between each of the buried contacts 170 and each of the landing pads 180.

The first conductive barrier layer 174 may be formed between each of the landing pads 180 and each of the cell insulating spacer structures 150 and between each of the bit line structures 140 and each of the landing pads 180.

In the first through peripheral circuit regions C/P-A1, C/P-A2, C/P-B1 and C/P-B2, the peripheral insulating spacer structure 250 may be formed on sidewalls of the first and second gate electrode structures 242Aa and 242Ba and the peripheral circuit insulating capping line 148B. The peripheral insulating spacer structure 250 may include the first peripheral insulating spacer 252, the second peripheral insulating spacer 254 and the third peripheral insulating spacer 256.

In the first through peripheral circuit regions C/P-A1, C/P-A2, C/P-B1 and C/P-B2, the insulating layer 230 may be formed around the first and second gate electrode structures 242Aa and 242Ba, the peripheral circuit insulating capping line 148B and the peripheral insulating spacer structure 250.

A portion of the insulating layer 230 may be etched in the first through peripheral circuit regions C/P-A1, C/P-A2, C/P-B1 and C/P-B2 to form the contact hole 270H. The peripheral circuit active region 119 may be exposed through the contact hole 270H. The second conductive barrier layer 274 may be formed on the inner surface of the contact hole 270H. In the first through peripheral circuit regions C/P-A1, C/P-A2, C/P-B1 and C/P-B2, a conductive material may be deposited on the conductive barrier layer 274 to form a conductive line 280.

Figure 17:
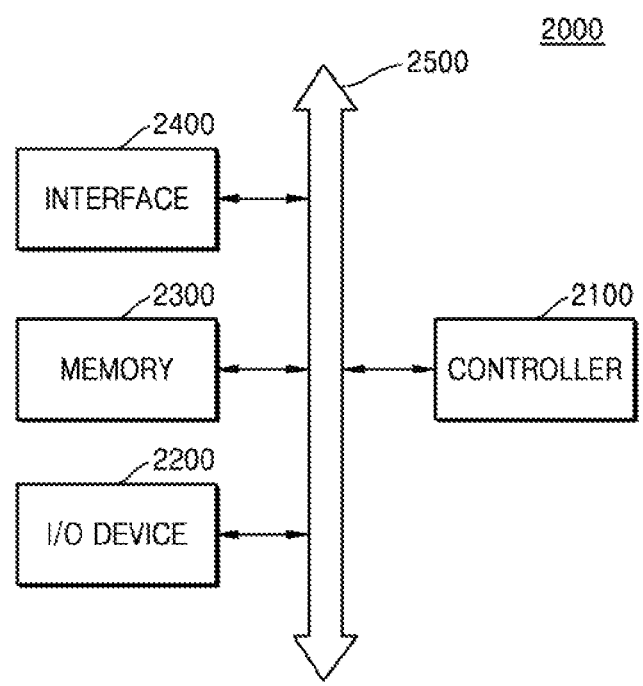
FIG. 17 is a block diagram illustrating an electronic system including a semiconductor device according to an exemplary embodiment of the present inventive concept.

FIG. 17 is a block diagram illustrating an electronic system including a semiconductor device according to an exemplary embodiment of the present inventive concept.

Referring to FIG. 17, an electronic system 2000 may include a controller 2100, an input/output (I/O) device 2200, a memory device 2300 and an interface unit 2400. The electronic system 2000 may be a mobile system or a system transmitting and receiving information. In some exemplary embodiments of the present inventive concept, the mobile system may be a personal digital assistant, a portable computer, a web tablet, a wireless phone, a mobile phone, a digital music player or a memory card. The controller 2100 may control an execution program in the electronic system 2000 and may include a microprocessor, a digital signal processor, a microcontroller or the like. The input/output device 2200 may be used to input or output data of the electronic system 2000. The electronic system 2000 may be connected to an external device, e.g., a personal computer or a network using the input/output device 2200 and may exchange data with the external device. The input/output device 2200 may include a keypad, a keyboard or a display device.

The memory device 2300 may store data and/or codes for operation of the controller 2100 or data processed in the controller 2100. The memory device 2300 may include at least one of the semiconductor devices according to an exemplary embodiment of the present inventive concept described with reference to FIGS. 1 through 16.

The interface unit 2400 may be a data transmitting path between the electronic system 2000 and another external device. The controller 2100, the input/output device 2200, the memory device 2300 and the interface unit 2400 may communicate with each other via a bus 2500.

The electronic system 2000 may be applied to a MP3 player, a navigation system, a portable multimedia player, a solid state drive (SSD) or household appliances.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor device comprising:
   a substrate including a cell array region, the cell array region including a cell active region;
   an insulating pattern on the substrate, the insulating pattern including a direct contact hole which exposes the cell active region and extends into the cell active region;
   a direct contact conductive pattern in the direct contact hole, wherein the direct contact conductive pattern is connected to the cell active region; and
   a bit line on the insulating pattern, the bit line connected to the direct contact conductive pattern and extending in a direction,
   wherein the insulating pattern includes a first insulating pattern including a non-metal-based dielectric material and a second insulating pattern on the first insulating pattern, the second insulating pattern including a metal-based dielectric material having a higher dielectric constant than a dielectric constant of the first insulating pattern,
   wherein the semiconductor device further comprises:
   a peripheral circuit region including a peripheral circuit active region in the substrate; and
   a first peripheral circuit gate insulating layer and a first gate electrode structure on the peripheral circuit active region in the peripheral circuit region,
   wherein the first pheripheral circuit gate insulating layer includes a third insulating pattern and a fourth insulting pattern on the third insulating pattern, the third insulating pattern including a same material as the first insulating pattern and the fourth insulating pattern including a same material as the second insulating pattern, and
   wherein the semiconductor device further comprises:
   a second peripheral circuit gate insulating layer and a second gate electrode structure on the peripheral circuit active region in the peripheral circuit region,
   wherein the second peripheral circuit gate insulating layer includes a fifth insulating pattern and a sixth insulating pattern on the fifth insulating pattern,
   wherein the fifth insulating pattern includes a non-metal-based dielectric material having a dielectric constant that is higher than a dielectric constant of the first insulating pattern and is lower than a dielectric constant of the second insulating pattern, and
   wherein the sixth insulating pattern includes a same material as the second insulating pattern.

2. The device according to claim 1, wherein a thickness of the first insulating pattern is greater than a thickness of the second insulating pattern.

3. The device according to claim 1, wherein the second insulating pattern includes a first portion that is under the bit line in the cell array region and a second portion that is not under the bit line in an area outside the cell array region, and an upper surface of the second portion is lower than an upper surface of the first portion in the area outside the cell array region.

4. The device according to claim 1, further comprising an insulating spacer structure on opposite sidewalls of the bit line, wherein the insulating spacer is in direct contact with the second insulating pattern.

5. The device according to claim 1, wherein a thickness of the fifth insulating pattern is smaller than a thickness of the third insulating pattern.

6. The device according to claim 1, wherein each of the first and second gate electrode structures includes a semiconductor-based conductive pattern and a metal-based conductive pattern.

7. The device according to claim 1, wherein the first gate electrode structure includes a stack structure including a first metal-based work function adjustment pattern and a first metal-based conductive pattern, the first metal-based work function adjustment pattern in direct contact with the first peripheral circuit gate insulating layer, and
   wherein the second gate electrode structure includes a stack structure including a second metal-based work function adjustment pattern and a second metal-based conductive pattern, the second metal-based work function adjustment pattern in direct contact with the second peripheral circuit gate insulating layer and the second metal-based conductive pattern including a same material as the first metal-based conductive pattern.

8. A semiconductor device comprising:
   a substrate including a cell array region and a peripheral circuit region, the cell array region including a cell active region and the peripheral circuit region including a peripheral circuit active region;
   a cell insulating pattern on the substrate in the cell array region;
   a direct contact hole penetrating the cell insulating pattern, the direct contact hole exposing the cell active region and extending into the cell active region;
   a direct contact conductive pattern in the direct contact hole and connected to the cell active region;
   a bit line connected to the direct contact conductive pattern in the cell array region, the bit line extending in a first direction on the cell insulating pattern and including a first metal-based conductive pattern in direct contact with the cell insulating pattern;
   a first peripheral circuit gate insulating layer and a first gate electrode structure that are sequentially disposed on the peripheral circuit active region in the peripheral circuit region, the first gate electrode including a first metal-based work function adjustment pattern and a second metal-based conductive pattern including a same material as the first metal-based conductive pattern; and
   a second peripheral circuit gate insulating layer and a second gate electrode structure that are sequentially disposed on the peripheral circuit region in the peripheral circuit region,
   wherein each of the cell insulating pattern and the first peripheral circuit gate insulating layer includes a first insulating pattern and a second insulating pattern on the first insulating pattern, the first insulating pattern including a non-metal based dielectric material and the second insulating pattern being thinner than the first insulating pattern and including a metal-based dielectric material having a higher dielectric constant than the first insulating pattern, wherein the second peripheral circuit gate insulating layer includes a third insulating pattern and a fourth insulating pattern on the third insulating pattern, wherein the third insulating pattern is thinner than the first insulating pattern and includes a non-meal-based dielectric material having a dielectric constant that is higher than a dielectric constant of the first insulating pattern and is lower than a dielectric constant of the second insulating pattern, and wherein the fourth insulating pattern includes a same material as the second insulating pattern.

9. The device according to claim 8, wherein the first gate electrode structure further comprises a first semiconductor-based conductive pattern between the first metal-based work function adjustment pattern and the second metal-based conductive pattern.

10. The device according to claim 8, wherein the first metal-based work function adjustment pattern is in direct contact with the first peripheral circuit gate insulating layer and the second metal-based conductive pattern.

11. The device according to claim 8, wherein the first insulating pattern and the second insulating pattern overlap with each other along a direction orthogonal to an upper surface of the substrate, and wherein the second insulating pattern has an upper surface including a first portion that is under the bit line in the cell array region and a second portion that is not under the bit line in the cell array region, and wherein the second portion of the second insulating pattern is lower than the first portion in the cell array region.

12. The device according to claim 8, wherein in the cell array region, the second insulating pattern is disposed at only a position overlapping with the bit line, and the first insulating pattern extends in opposite lateral directions from a portion overlapping with the bit line.

13. The device according to claim 8, wherein the second gate electrode structure includes a second metal-based work function adjustment pattern and a third metal-based conductive pattern, the third metal-based conductive pattern in direct contact with the second metal-based work function adjustment pattern and including a same material as the first metal-based conductive pattern.

14. The device according to claim 8, wherein the second gate electrode structure includes a second metal-based work function adjustment pattern in direct contact with the second peripheral circuit gate insulating layer, a third metal-based conductive pattern including a same material as the first metal-based conductive pattern, and a second semiconductor-based conductive pattern between the second metal-based work function adjustment pattern and the third metal-based conductive pattern.

* * * * *